(12) United States Patent
Fries

(10) Patent No.: US 7,468,238 B2
(45) Date of Patent: *Dec. 23, 2008

(54) MASKLESS PHOTOLITHOGRAPHY FOR USING PHOTOREACTIVE AGENTS

(75) Inventor: David P. Fries, St. Petersburg, FL (US)

(73) Assignee: University of South Florida, Tampa, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/297,695

(22) Filed: Dec. 8, 2005

(65) Prior Publication Data

US 2006/0088789 A1  Apr. 27, 2006

Related U.S. Application Data

(63) Continuation of application No. 10/179,078, filed on Jun. 25, 2002, now Pat. No. 7,049,049.

(60) Provisional application No. 60/301,218, filed on Jun. 27, 2001.

(51) Int. Cl.
G03F 7/20 (2006.01)

(52) U.S. Cl. .................. 430/320; 430/322; 355/67; 355/71

(58) Field of Classification Search .............. None
See application file for complete search history.

(56) References Cited

U.S. PATENT DOCUMENTS

| | | | |
|---|---|---|---|
| 3,925,677 A | 12/1975 | Fraser | |
| 4,199,688 A | 4/1980 | Ozasa | |
| 5,079,544 A | 1/1992 | DeMond et al. | |
| 5,585,477 A | 12/1996 | Kilpatrick | |
| 5,661,500 A | 8/1997 | Shinoda et al. | |
| 5,691,541 A | 11/1997 | Ceglio et al. | |
| 5,866,913 A | 2/1999 | Robinson | |
| 5,870,176 A | 2/1999 | Sweatt et al. | |
| 5,900,637 A | 5/1999 | Smith | |
| 6,060,224 A | 5/2000 | Sweatt et al. | |
| 6,177,980 B1 | 1/2001 | Johnson | |
| 6,188,519 B1 | 2/2001 | Johnson | |
| 6,238,830 B1 | 5/2001 | Rangarajan et al. | |
| 6,238,852 B1 | 5/2001 | Klosner | |
| 6,251,550 B1 | 6/2001 | Ishikawa | |
| 6,295,153 B1 * | 9/2001 | Garner | 359/212 |
| 6,375,903 B1 * | 4/2002 | Cerrina et al. | 422/131 |
| 6,379,867 B1 | 4/2002 | Mei et al. | |
| 7,049,049 B2 * | 5/2006 | Fries | 430/311 |
| 2002/0024714 A1 | 2/2002 | Sandstrom et al. | |

FOREIGN PATENT DOCUMENTS

| | | |
|---|---|---|
| EP | 0 971 387 | 1/2000 |
| EP | 1 033 741 | 9/2000 |
| JP | 57017132 | 1/1982 |
| JP | 63196038 | 8/1988 |
| JP | 63066432 | 9/1988 |
| JP | 03030415 | 2/1991 |
| JP | 03034312 | 2/1991 |
| JP | 03174716 | 7/1991 |
| JP | 04042533 | 2/1992 |
| JP | 04192422 | 7/1992 |
| JP | 06029205 | 2/1993 |
| JP | 05190517 | 7/1993 |
| JP | 07022303 | 7/1993 |
| JP | 05259045 | 8/1993 |
| JP | 0 045906 | 7/1994 |
| JP | 06216006 | 8/1994 |
| JP | 08046906 | 2/1998 |
| WO | WO-9804950 | 2/1998 |
| WO | WO-9938187 | 7/1999 |

OTHER PUBLICATIONS

Singh-Gasson et al., "Maskless Fabrication of Light-Directed Oligonucleotide Microarrays Using a Digital Micromirror Array", Nature Biotechnology, 1999, pp. 974-978, vol. 17.

Gibbs, "New Chip Off the Old Block", Scientific American, Sep. 1996, online document, 3 pages.

Johnson, "Micromirror Arrays Perform Photolithography Step", EETIMES, 1999, online document, 5 pages.

Mendoza et al., "High-Throughput Microarray-Based Enzyme-Linked Immunosorbent Assay (ELISA)", Biotechniques, 1999, online document, 1 page.

Dobrowolski et al., "DNA Microarray Technology for Neonatal Screening", Acta Paediatr Suppl, 1999, online document, 1 page.
Nuwaysir et al., "Microarrays and Toxicolgoy: the Advent of Toxicogenomics", Mol Carcinog, 1999, online document, 1 page.
Khan et al., "Expression Profiling in Cancer Using cDNA Microarrays", Electrophoresis, 1999, online document, 1 page.
Epstein et al., "Microarray Technology—Enhanced Versatility", Persistent Challenge, 2000, online document, 1 page.
Romero et al., "Reverse-Transcription Poylmerase Chain Reaction Detection of the Enteroviruses", Arch Pathol Lab Med, 1999, online document, 1 page.
Sellwood et al., "The Use of Reverse Transcriptase-Polymerase Chain Reaction to Investigate Environmental Samples for the Presence of Enteroviruses", Commun Dis Public Health, 1998, online document, 1 page.
Kurian et al., "DNA Chip Technology", J Pathol, 1999, online document, 1 page.
<http://www.envisiontec.de> www.envisiontec.de (Publication date on website is unknown.), 11 pages, Oct. 2002.
<http://www.micronic.se> www.micronic.se. Note that their micromirror technology is termed SLM technology (The link to this info is: http://www.micronic.se/site_eng/framesets/frame_products.html <http://www.micronic.se/site_eng/framesets/frame_products.html (Publication date on website in unknown.), 2 pages, Oct. 2002.
Abber, Russell L., "Photochemical Vapor Deposition", *Handbook of Thin Film Deposition Processes and Techniques*, 1988, Chapter 8, pp. 270-290, Noyes Publications, Park Ridge, New Jersey, USA.
JP- 03034312, published Feb. 14, 1991; Masaru et al. (Abstract only).
JP- 03030415, published Feb. 8, 1991; Ikuo (Astract only).
JP- 63196038, published Aug. 15, 1988, Iida (Abstract only).
JP- 63086432, published Sep. 30, 1986, Nakasuji et al. (Abstract only).
JP- 57017132, published Jan. 28, 1982, Okabe (Abstract only).
JP- 03174716, published Jul. 29, 1991, Yoshinori et al. (Abstract only).
JP- 04042533, published Feb. 13, 1992, Kumaaru et al. (Abstract only).
JP- 04192422, published Jul. 10, 1992, Mamoru et al. (Abstract only).
EP- 1 033 741, published Sep. 6, 2000, Maruyama et al. (Abstract only).
EP- 0 971 387, published Jan. 12, 2000, Garcia et al. (Abstract only).
JP- 07022303, published Jul. 1, 1993; Ando et al. (Abstract only).
WO- 09938187, published Jul. 29, 1999, Garcia (Abstract only).
WO- 09804950, published Feb. 5, 1998, Jain et al. (Abstract only).
JP- 06216006, published Aug. 5, 1994, Minoru. (Abstract only).
JP- 05259045, published Aug. 5, 1994, Yoshio, et al. (Abstract only).
JP- 05190517, published Aug. 10, 1993, Heiji. (Abstract only).
JP- 05029205, published Jul. 30, 1993 Kazuhiko et al. (Abstract only).
Tanaka et al., "High-Precision Binary Optical Element Fabricated by Novel Self-Aligned Process", Japanese Journal of Applied Physics, 1999, pp. 6976-6980, vol. 38, No. 12B (Abstract only).
Topper et al., "Low Cost Electroless Copper Metallization of BCB for High-Densisty Wiring Systems", Proceedings International Symposium on Advanced Packaging Materials, 1999, pp. 202-206 (Abstract only).
Lin et al., "An Improved Heterojunction-Emitter Bipolar Transistor Using Delta-Doped and Spacer Layers", Materials Chemistry and Physics, 1999, pp. 91-95, vol. 59, No. 1 (Abstract only).
Genolet et al., "Soft, Entirely Photoplastic Probes for Scanning Force Microscopy", Review of Scientific Instruments, 1999, pp. 2398-2401, vol. 70, No. 5 (Abstract only).
Sthel et al., "Testing a Furfuryl Alchohol Resin as a Negative Photoresist", Polymer Testing, 1999, pp. 47-50, vol. 18, No. 1 (Abstract only).
Karafyllidis et al., "Modelling and Simulation", Microelectronic Engineering, 1999, pp. 71-84, vol. 45, No. 1 (Abstract only).
Sekiguchi et al., "Influence of Underlayer Reflection on Optical Proximity Effects in Sub-Quarter Micron Lithography", Proceedings of the SPIE- The International Society for Optical Engineering, 1998, pp. 347-355 vol. 3334 (Abstract only).

Maeda et al., "ArF Chemically Amplified Negative Resist Using Allcyclic Epoxy Polymer", Journal of Photopolymer Science and Technology, 1998, pp. 507-512, vol. 11, No. 3 (Abstract only).
Kudo et al., "Optimization of DUV Negative Resists for 0.15 mu m Lithography", Journal of Photopolymer Science and Technology, 1998, pp. 445-454 vol. 11, No. 1 (Abstract only).
Wallraff et al., "Etch Selectivity of 4SiMA:hydroxystyrene based copolymers. Silicon Chemistry for Bilayer Resist Systems", Journal of Photopolymer Science and Technology, 1998, pp. 673-679, vol. 11, No. 4 (Abstract only).
Dabbach et al., "Capabilities and Limitations of Plasma Polymerized Methylsilane (PPMS) All-Dry Lithography", Journal of Photopolymer Science and Technology, 1996, pp. 651-661, vol. 11, No. 4 (Abstract only).
Karafyllidis et al., "Negative Resist Profiles in 248 nm Photolithography: Experiment, Modelling and Simulation", Semiconductor Science and Technology, 1998, pp. 603-610, vol. 13, No. 6 (Abstract only).
Robertson et al., "New Patternable Dielectric and Optical Materials for MCM-L/D- and o/e MCM-Packaging", Proceedings. The First IEEE International Symposium on Polymeric Electronics Packaging, 1997, pp. 203-212 (Abstract only).
Hauouel et al., "Dependence of Developed Negative Resist Profiles on Exposure Energy Dose: Experiment, Modeling, and Simulation", Microelectronic Engineering, 1998, pp. 351-354, vol. 41-42 (Abstract only).
Suzuki et al., "Proposal of Coplanar-type High-$T_c$/Superconducting Field-effect Devices", Physica C, 1997, pp. 2495-2496, vol. 282-287 (Abstract only).
Inanami et al., "50 nm Pattern Etching of SI Wafer By Synchrotron Radiation Excited $CF_4$/plasma", Japanese Journal of Applied Physics, 1997, pp. 7706-7709, vol. 36, No. 12B (Abstract only).
Yasuzato et al., "Optical Proximity Correction of Alternating Phase-Shift Masks for 0.18 mu m KrF Lithography", Proceedings of the SPIE, 1997, pp. 751-762, vol. 3051 (Abstract only).
Op De Beeck et al., "NA/sigma Optimization Strategies for an Advanced DUV Stepper Applied to 0.25 mu m and sub-0.25 mu m Critical Levels", 1997, pp. 320-332, vol. 3051 (Abstract only).
Hulsmann et al., "Edge-Phase-Shifting Lithography for sub 0.3 mu m T-Gates" Proceedings of the SPIE, 1997, pp. 295-303, vol. 3051 (Abstract only).
Jungchul et al., "Measuring Flare and its Effect on Process Latitude", Proceedings of the SPIE, 1997, pp. 708-713, vol. 3051 (Abstract only).
Guerin et al., "Simple and Low Cost Fabrication of Embedded Micro-Channels by Using a New Thick-Film Photoplastic", Transducers 97, 1997, pp. 1419-1422, vol. 2 (Abstract only).
La Fontaine et al., "Characterization of SAL605 Negative Resist at Lambeda=13 nm ", OSA Trends ion Optics and Photonics, 1996, pp. 39-41, vol. 4 (Abstract only).
Cha-Won Koh et al., "Characterization of the Resist Pattern Collapse in a Chemically Amplified Resist", Proceedings of the Microlithography Seminar Interface '96, 1996, pp. 295-302 (Abstract only).
Miller et al., "Getting the Most from I-Line Technology by Optimizing Numerical Aperture and Partial Coherence for Critical Layers", Proceedings of the Microlithography Seminar Interface '96, 1996, pp. 269-278 (Abstract only).
Katsumata et al., "Chemically Amplified Resist Process for 0.25 mu m Generation Photomasks", Proceedings of the SPIE, 1996, pp. 83-91, vol. 2884 (Abstract only).
Lee-Soon Park et al., "Effect of Membrane Structure on the Performance of Field-Effect Transistor Potassium-Sensitive Sensor", Sensors and Actuators, 1996, pp. 239-243, vol. A57, No. 3 (Abstract only).
Katsumata et al., "A Chemically Amplified Resist Process for 0.25 mu m Generation Photomasks", Proceedings of the SPIE, 1996, pp. 98-104, vol. 2793 (Abstract only).
Wada et al., "New Concept for Negative Tone Electron Beam Resist", Proceedings of the SPIE, 1996, pp. 70-77, vol. 2793 (Abstract only).
Flack et al., "An Investigation of the Properties of Photosensitive Polyimide Films", Proceedings of the SPIE, 1996, pp. 169-185, vol. 2728 (Abstract only).

Op De Beeck et al., "Optical Proximity Effects and Correction Strategies for Chemical Amplified DUV Resists", Proceedings of the SPIE, 1996, pp. 622-633, vol. 2728 (Abstract only).

Lin et al., "Water Soluble Resist for "Environmentally Friendly" Lithography", Proceedings of the SPIE, 1998, pp. 308-318, vol. 2725 (Abstract only).

Nicolau et al., "Application of DNQ-Based Microlithography to Patterning Bioactive Molecules and Cells" Proceedings of the SPIE, 1996, pp. 500-511, vol. 2724 (Abstract only).

Gabor et al., "Block and Random Copolymer Resists Designed for 193 nm Lithography and Enivronmentally Friendly Supercritical CO/sub 2/ Development", Proceedings of the SPIE, 1996, pp. 410-417, vol. 2724 (Abstract only).

Huang et al., "A Negative Tone Resist System Using Vinyl Cyclic Acetal Crosslinker", Proceedings of the SPIE, 1996, pp. 315-322, vol. 2724 (Abstract only).

Mori et al., "Investigation of Substrate-Effect in Chemically Amplified Resist", Proceedings of the SPIE, 1996, pp. 131-138, vol. 2724 (Abstract only).

Vinet et al., "Undercut Elimination in DUV Negative Systems: Application to Lithography and Etching of Metal Levels", Proceedings of the SPIE, 1996, pp. 82-91, vol. 2724 (Abstract only).

Kawahito et al., "Micro-Fluxgate Magnetic Sensing Elements Based on Silicon Microtechnology", Proceedings of the SPIE, 1996, pp. 134-137 (Abstract only).

Larsen et al., "Design and Fabrication of Compliant Micromechanisms and Structures with Negative Poisson's Ratio", Proceedings IEEE, The Ninth Annual International Workshop on Micro Electro Mechanical Systems, 1996, pp. 365-371 (Abstract only).

Yan et al., "DUV Wafer Processes", Proceedings of the SPIE, 1995, pp. 158-168, vol. 2621 (Abstract only).

Suzuki et al., "Focused Ion Beam/Optical-Merged Lithographic Technique Using Ladder Silicone Spin-on Glass", Journal of Vacuum Science & Technology B, 1995, pp. 2593-2596, vol. 13, No. 6 (Abstract only).

Arai et al., "Application of Chemically Amplified Resists to Photomask Fabrication", Proceedings of the SPIE, 1995, pp. 74-87, vol. 2512 (Abstract only).

Farrar et al., "0.35 Microgram DUV Lithography for Poly Gate Layer", Proceedings of the SPIE, 1994, pp. 321-331, vol. 2196 (Abstract only).

Pierre et al., "EDMES: an Expert System for Process Optimization in Micro-lithography", Proceedings of the SPIE, 1994, pp. 267-277, vol. 2196 (Abstract only).

Op De Beeck et al., "Lithographic Strategies for 0.35 mu m Poly Gates for Random Logic Applications", Proceedings of the SPIE, 1994, pp. 407-421, vol. 2195 (Abstract only).

Goethals et al., "Proximity Effects in Dry Developed Lithography for Sub-0.35 mu m Application", Proceedings of the SPIE, 1994, pp. 394-406, vol. 2195 (Abstract only).

Nakano et al., "Transparent Photoacid Generator (ALS) for ArF Excimer Laser Lithography and Chemically Amplified Resist", Proceedings of the SPIE, 1994, pp. 194-204, vol. 2195 (Abstract only).

Drozdov et al., "Quantum Wires With Controllable Conducting-Channel Width Based on IN/sub 0.53/Ga/sub 0.47/As/InP Heterostructures", Semiconductors, 1994, pp. 183-187, vol. 28, No. 2 (Abstract only).

Tomo et al., "Process Issue Improvement of Surface Image Transfer Technique: Depth-of-Focus Characteristics and Their Comparison with Simulation Results", Journal of Vacuum Science & Technology B, 1993, pp. 2725-2732, vol. 11, No. 6 (Abstract only).

Ren et al., "Fabrication of Y-Gate, Submicron Gate Length GaAs Metal-Semiconductor Field Effect Transistors", Journal of Vacuum Science & Technology B, 1993, pp. 2603-2606, vol. 11, No. 6 (Abstract only).

Martin et al., "Effects of Focused Ion Beam Reticle Repair on Optical Lithography at I-Line and Deep UltraViolet Wavelengths", Journal of Vacuum Science & Technology B, 1993, pp. 427-431 (Abstract only).

Dietz et al., "The Process of Dry Film Lamination YPCB Manufacture", Printed Circuit Fabrication, 1999, pp. 42-45 vol. 22, No. 9 (Abstract only).

Waldner, "Registration Concepts for Today's Multlayers YPCB Manufacture", Proceedings of the EPC, 1998, p. 1-14 (Abstract only).

Hoffman, "Photosensitive Dielectrics for New SBU-Technology YPCB Manufacture", Proceedings of the EPC, 1998, pp. 1-10 (Abstract only).

Hertlein, "Performance and Limits of Photolithographic Technology: PCB Manufacturing Technology Following Microelectronics Production Technologies", Proceedings of the EPC, 1998, pp. 1-7 (Abstract only).

Blake, "How Will Direct Imaging Affect AOI? YPCB Manufacture", CircuiTree, 1999, pp. 162,4,6 and 8, vol. 12, No. 3 (Abstract only).

Gandhi et al., "HDI PCBs, I", Printed Circuit Fabrication, 1999, pp. 30, 32, 34, vol. 22, No. 3 (Abstract only).

Copeland, "Impedance Control Accuracy YPCB Measurement", Printed Circuit Fabrication, 1999, pp. 26-28, 30, vol. 22, No. 2 (Abstract only).

Weinhold et al., "PWB Laminates for High-Performance Applications", Electronic Packaging and Production, 1998, pp. 77-78, 80-81, vol. 38, No. 10 (Abstract only).

Seyfert, "Dimensional Stability Characteristics YPCB Photocols", Printed Circuit Fabrication, 1998, pp. 62-63, vol. 21, No. 7 (Abstract only).

Halevi et al., "Cost-Effective LDI YPCB Lithography", Printed Circuit Fabrication, 1998, pp. 30-31, vol. 21, No. 7 (Abstract only).

Rittichier et al., "Laser Direct Imaging: A Strategic Inflection Point YPCB Manufacture", 1998, pp. 124, 126, 128, vol. 11, No. 6 (Abstract only).

Ben-Ezra, "Meeting the Challenges of Direct Imaging for Cost-Effective Production YPCBs", 1998, pp. 108, 110, 112 vol. 11, No. 6 (Abstract only).

Atiya, "An Innovative Laser Direct Imaging System YPCB Inner Layers", Circuitree, 1998, pp. 94, 96, 98, vol. 11, No. 6 (Abstract only).

Raine, "Tenting: Cost Effective Fabrication of High-Density PWBs for the Year 200 and Beyond", Circuit World, 1998, pp. 6-10, vol. 24, No. 3 (Abstract only).

Knudsen, "Using a New Photoimageable Dielectric for PWB Sequential Build-Up Technology", Proceedings. The First IEEE International Symposium on Polymeric Electronics Packaging, 1997, pp. 33-41 (Abstract only).

Heath et al., "Microvies Buildup PWBs: Next Generation Substrates", SMTA National Symposium, 1997, pp. 1-9 (Abstract only).

Brandt et al., "Ground and Power Planes for Impedance-Control and EMI Shielding in PCBs Made from Conductive TLPS Pastes", Proceedings of the Technical Conference, 1997, pp. S6/7/1-7 (Abstract only).

Harris, "Zero Touch-Up YPCB Photolithography", Proceedings of the Technical Conference, 1997, pp. S5/5/1-5 (Abstract only).

McGrath, "Multilayer PCB Manufacture Using a Permanent Photoresist—It Can Be Done", Proceedings of the Technical Conference, 1997, pp. S5/4/1-5 (Abstract only).

Murray, "Laser Imaging Onto Dirtect-Write Film YPCB Manufacture", Proceedings of the Technical Conference, 1997, pp. S15/4/1-4 (Abstract only).

Morrison, "TEA CO/sub 2/ Laser Micro Via Fabrication in Standard and Emerging PWB Dielectrics", Proceedings of the Technical Conference, 1997, pp. S15/3/1-7 (Abstract only).

Siddhaye, "Integration of Environmental Factors in Process Modelling for Printed Circuit Board Manufacturing, II. Fabrication", Proceedings of the 1997 IEEE International Symposium on Electronics and the Environment, 1997, pp. 226-233 (Abstract only).

Linn et al., "An Investigation on Artwork Image Mis-Alignment in Printed Circuit Board Manufacturing", 6th Industrial Engineering Research Conference Proceedings, 1997, pp. 696-701 (Abstract only).

Hu et al., "Cost Analysis for High Density Printed Wiring Board Manufacturing Processes", IPCWorks '96 Proceedings, 1996, pp. 1-5 (Abstract only).

Jain et al., "High-Speed, High-Resolution Ylarge-Area PCB Exposure System", Printed Circuit Fabrication, 1997, pp. 34, 36, vol. 20, No. 5 (Abstract only).

Murray, "Direct Write Film YPCB Photocols", Printed Circuit Fabrication, 1997, pp. 24, 26-28, vol. 20, No. 5 (Abstract only).
Brautigam et al., "Ultra-High Intensity Imaging YPCB Technology", Printed Circuit Fabrication, 1997, pp. 20-2vol. 20, No. 5 (Abstract only).
Chew et al., "Wastewater Recycling and Copper Recovery at a California PCB Shop", CircuiTree, 1997, pp. 132, 134, 136, 138, vol. 10, No. 5 (Abstract only).
Ho, "What's Up With SBU Technology? YPCB Sequential Build-Up", Printed Circuit Fabrication, 1997, pp. 64,66,68, vol. 20, No. 3 (Abstract only).
Bergman, "Relieving the Points of Pain YPCB Data Transfer", Printed Circuit Fabrication, 1997, pp. 50, 52, 64, vol. 20, No. 3 (Abstract only).
Singer et al., "Conventional Versus Build-Up PWB Fabrication: Cost Implications for Electronic Packaging", Proceedings of the 1996 International Electronics Packaging Conference, 1998, pp. 443-456 (Abstract only).
Ben-Ezra et al., "Direct Imaging Comes of Age YPCB Lithography", CircuiTree, 1997, pp. 80, 82, 86, vol. 10, No. 3 (Abstract only).
Miller et al., "Zero Wastewater Discharge YPCB Manufacture", Printed Circuit Fabrication, 1996, pp. 32, 34-36, vol. 19, No. 11 (Abstract only).
Meiler et al., "New Photodielectric for the Sequential Build-Up (SBU) of High-Density Interconnect (HDI) PWB", Proceedings of the Printed Circuit World Convention VII, 1996, pp. PO08/1-2 (Abstract only).
Lutschounig et al., "Buried Jumper Technology YPCBs", Proceedings of the Printed Circuit World Convention VII, 1996, pp. P16/1-11 (Abstract only).
Wedeking, "Tooling Data Farm YPCB CAD/CAM", Proceedings of the Printed Circuit World Convention VII, 1996, pp. P4/1-5 (Abstract only).
Tanizawa, "IBSS (R) Based PCB Technology for High Pin Count/Fine Pitch Package Assembly", Proceedings of the Printed Circuit World Convention VII, 1996, pp. P21/1-6 (Abstract only).
Ohta, "Development of DVH-ADD Printed Wiring Board for High Density MCM", Proceedings of the Printed Circuit World Convention VII, 1996, pp. P21/1-6 (Abstract only).
McGregor, "Effects of Copper Foil Type and Surface Preparation on Fine Line Image Transfer in Primary Imaging of Printed Wiring Boards", Proceedings of the Printed Circuit World Convention VII, 1996, pp. 17/1-20 (Abstract only).
Vaughan et al., "Advances in Environmentally Conscious Manufacturing Through the Use of Permanent Photoimageable Materials in PWB Fabrication", Proceedings of the Printed Circuit World Convention VII, 1996, pp. S10/3/1-5 (Abstract only).
Conrod et al., "PhotoDefinable Dielectric Materials for High Density Printed Wiring Board Applications", Proceedings of the Technical Conference IPC Printed Circuits EXPO, 1996, pp. S8/6/1-6 (Abstract only).
Nakahara et al., "Review of the Current Status of Laser Direct Imaging YPCB Manufacture", Proceedings of the Technical Conference IPC Printed Circuits EXPO, 1996, pp. S8/1/1-3 (Abstract only).
Aday et al., "A Comparative Analysis of High Density PWB Technologies", Proceedings of the SPIE, 1996, pp. 239-244, vol. 2794 (Abstract only).
Holden, "Comparing Costs for Various PWB Build-Up Technologies YMCM-L", 1996, pp. 15-21, vol. 2794 (Abstract only).
Eickmans, "Mastertool: A New Dry Protocol in the Production of Printed Circuit Boards", Circuit World, 1996, pp. 28-32, vol. 22, No. 3 (Abstract only).
Crum, "Imaging Technology: Today, Tomorrow and Beyond YPCB Manufacture", Electronic Packaging and Production, 1996, vol. 36, No. 3 (Abstract only).
Layden, "Is Photoplotting Finally Seeing the Light? II. YPCB Design", Printed Circuit Design, 1995, pp. 27-28, vol. 12, No. 12 (Abstract only).
Ohlig, "Lighting Equipment and Fine-Line Production YPCB Lithography", Printed Circuit Fabrication, 1996, pp. 32-33, vol. 19, No. 1 (Abstract only).
Frauzem, "Increasing Productivity YPCB Lithography", Printed Circuit Fabrication, 1996, pp. 26-28, vol. 19, No. 1 (Abstract only).

Nakamura et al., "High Reliability, High Density Build Up Printed Circuit Board for MCM-L", Proceedings 1995 International Conference on Multichip Modules (SPIE), 1995, pp. 36-41, vol. 2575 (Abstract only).
Layden, "Is Photoplotting Finally Seeing the Light? I. YPCB Design", Printed Circuit Design, 1995, pp. 16-17 (Abstract only).
Yoshiki et al., "Pattern Formation of Cu Layer By Photocatalytic Reaction of ZnO Thin Film Y Printed Circuit Boards", Journal of the Electrochemical Society, 1995, pp. L235-7, vol. 142, No. 12 (Abstract only).
Dietz, "Fine Line Imaging (PCB Photolithography)", Printed Circuit Fabrication, 1995, pp. 32, 34, 36, vol. 18, No. 10 (Abstract only).
Bridges, "Fine-Line Imaging. (PCB Manufacture)", Printed Circuit Fabrication, 1996, pp. 34, 36-38, vol. 18, No. 7 (Abstract only).
Schillhammer, "Rapid Multi-Layer PCB Prototyping in an Engineering Lab Environment", Proceedings of the Technical Program. National Electronic Packaging and Production Conference, 1994, pp. 49-52 (Abstract only).
Soules, "Dissecting Film Defects (PCB Manufacture, Imaging Contamination)", Printed Circuit Fabrication, 1994, pp. 26, 28, vol. 17, No. 12 (Abstract only).
Layton, "Gerber Basics: A PCB Primer-What is the Gerber Format, and Why Do I Need It?", Printed Circuit Fabrication, 1994, pp. 30-32, vol. 16, No. 7 (Abstract only).
Bowls et al., "Illuminating Imaging (PCB)", Printed Circuit Fabrication, 1993, pp. 40-41, vol. 16, No. 5 (Abstract only).
Timmons, "Imaging Large High Performance Printed Wiring Boards", Surface Mount International Conference and Exposition. Proceedings of the Technical Program, 1992, pp. 543-546, vol. 1 (Abstract only).
Kimura et al., "Mass-Production of PWBs With 5 Track Technology", NEC Technical Journal, 1993, pp. 77-81, vol. 45, No. 9 (Abstract only).
Shawhan et al., "Plated Copper Ceramic PWBs: a Versatile Metallization Technology", Hybrid Circuit Technology, 1992, pp. 28-33, vol. 8, No. 12 (Abstract only).
Venkata, "Industrial Fabrication of Printed Circuit Boards", Electrical India, 1990, pp. 13-21, vol. 30, No. 23 (Abstract only).
Rust, "Plasma cleaning of lands to improve bonding of surface mount components to printed wiring boards", IEPS, Proceedings of the Technical Conference, 1990, pp. 95-109 (Abstract only).
Lozano, "Photocols are Developing the Future of PCBs", Electronic Packaging and Production, 1990, pp. 42-44, vol. 30, No. 12 (Abstract only).
No-Author, "The Production of PCBs Using Pre-Sensitized Base Material", Revista Espanola De Electronica, 1990, pp. 36-38, No. 427 (Abstract only).
Weinhold, "Solder-Stopping Masks for Printed Circuit Boards", Elektronik Praxis, 1990, pp. 30-33, vol. 25, No. 15 (Abstract only).
Berry, A Fabricator's Experience With a Curtain Coatabe PILSM with SMT type PWBs, 1990, pp. 731-738, vol. 1 (Abstract only).
Pavese et al., "The Three Dimensions made in Italy (PCBs)" Elettronica Oggi, 1990, pp. 160-172, No. 90 (Abstract only).
Mougin et al., "Magnetic Micropatterning of FeNI/FeMn Exchange Bias Bilayers By Ion Irradiation", Journal of Applied Physics, 2001, pp. 6606-6608, vol. 89, No. 11 (Abstract only).
Guo et al., "Use of MicroFabricated Cold Field Emitters in Sub-100 nm Maskless Lithography", Journal of Vacuum Science & Technology, 2001, pp. 862-865, vol. 19, No. 13 (Abstract only).
Menon et al., "Zone-Plate-Array Lithography (ZPAL): Simulations for System Design", AIP Conference Proceedings, 2000, pp. 647-652, No. 507 (Abstract only).
Ishibashi et al., "Combining Atomic Force Microscopic Lithography with Photolithography", Japanese Journal of Applied Physics, 2000, pp. 7060, vol. 39, No. 12B (Abstract only).
Parker et al., "A High Throughput NGL Electron Beam Direct-Write Lithography System", Proceedings of the SPIE, 2000, pp. 713-720, vol. 3997 (Abstract only).
Dai et al., "Lossless Layout Compression For Maskless Lithography System", Proceedings of the SPIE, 2000, pp. 467-477, vol. 3997 (Abstract only).
Luo Xian-Gang, "Nanolithography Technology", Wuli, 2000, pp. 358-363, 350, vol. 29, No. 6 (Abstract only).

Parker et al., "A High Throughput Electron-Beam Direct-Write Lithography System", Microlithography World, 2000, pp. 22, 24-25, 30, vol. 9, No. 3 (Abstract only).
Lakner et al., "Micromirrors For Direct Writing Systems and Scanners", Proceedings of the SPIE, 1999, pp. 217-227, vol. 3878. (Abstract only).
Higgins et al., "Anisotropic Spinodal Dewetting as a Route to Self-Assembly of Patterned Surfaces", Nature, 2000, pp. 476-478, vol. 404, No. 6777 (Abstract only).
Polesello et al., "Micromachining of Silicon With a Proton Microbeam", Nuclear Instruments & Methods in Physics Research, 1999, pp. 173-178, vol. 158, No. 1-4 (Abstract only).
Carter et al., "Maskless, Parallel Paterning With Zone-Plate Array Lithography", Journal of Vacuum Science & Technology, 1999, pp. 3449-3452, vol. 17, No. 6 (Abstract only).
Carter et al., "Zone-Plate Array Lithography (ZPAL): A New Maskless Approach", Proceedings of the SPIE, 1999, pp. 324-332, vol. 3676 (Abstract only).
Watjen et al., "On the Interpretation of Micro-PIXE Measurements on a Prototype Microstructured Reference Material", Nuclear Instruments & Methods in Physics Research, 1999, pp. 532-537, vol. 150, No. 1-4 (Abstract only).
Pueker et al., "High Resolution Phase Zone Plates for Water Window Wavelengths", Proceedings of the SPIE, 1998, pp. 118-128, vol. 3449 (Abstract only).
Groves et al., "Distributed, Multiple Variable Shaped Electron Beam Column for High Throughput Maskless Lithography", Journal of Vacuum Sciences, 1998, pp. 3168-3173, vol. 16, No. 6 (Abstract only).
Fuller et al., "Photomask Edge Roughness Characterization Using an Atomic Force Microscope", Proceedings of the SPIE, 1998, pp. 433-440, vol. 3332 (Abstract only).
Descour et al., "Mass-Producible Microtags for Security Applications: Calculated Fabrication Tolerances By Rigorous Coupled-Wave Analysis", Optical Engineering, 1998, pp. 1254-1261, vol. 37, No. 4 (Abstract only).
Avramescu et al., "Atomic Force Microscope Lithography on Carbonaceous Films Deposited by Electron-Beam Irradiation", Applied Physics Letters, 1998, pp. 716-718, vol. 72, No. 6 (Abstract only).
Trau et al., "Microscopic Patterning of Orientated Mesoschopic Silia Through Guided Growth", Nature, 1997, pp. 674-676, vol. 390, No. 6861 (Abstract only).
Descour et al., "Mass-Producible Microtags for Security Applications: Tolerance Analysis by Rigorous Coupled-Wave Analysis", Proceedings of the SPIE, 1997, pp. 15-24, vol. 3009 (Abstract only).
Graham et al., "Conducting Polyaniline Coatings For Submicron Lithography and SEM Technology", Proceedings of the SPIE, 1997, pp. 105-113, vol. 3048 (Abstract only).
Sweatt et al., "Mass-Producible Microtags", OSA Trends in Optics and Photonics, 1996, pp. 212-214, vol. 4 (Abstract only).
Matsuo et al., "Investigations on Reaction Mechanisms in a Surface Modification Resist Process Using Chemical Vapor Deposition of Polysiloxane", Journal of Electrochemical Society, 1997, pp. 2903-2909, vol. 144, No. 8 (Abstract only).
No-Author, "Atom Optics", Proceedings of the SPIE, 1997, vol. 2995 (Abstract only).
Biebuyck et al., "Lithography Beyond Light: Microcontact Printing with Monolayer Resists", IBM Journal of Research and Development, 1997, pp. 159-170, vol. 41, No. 1-2 (Abstract only).
Terris et al., "Nanoscale Replication for Scanning Probe Data Storage", Applied Physics Letters, 1996, pp. 4262-4264, vol. 69. No. 27 (Abstract only).
Descour et al., "Mass-Producible Microscopic Computer-Generated Holograms: Microtags", Optics Letters, 1996, pp. 1951-1953, vol. 21, No. 23 (Abstract only).
Ishikawa et al., "Nanometer-Scale Pattern Formation of GaAs by in Situ Electron-Beam Lithography Using Surface Oxide Layer as a Resist Film", Journal of Vacuum Science, 1995, pp. 2777-2780, vol. 13, No. 6 (Abstract only).
Dz-Chi et al., "Comptuer Simulations For Mask Structure Heating in X-Ray Lithography", Computers and Structures, 1996, pp. 825-834, vol. 58, No. 4 (Abstract only).
Takechi et al., "Effects of Electron Beam Irradiation on Highly Oriented Poly (di-methyl silane) Film", Journal of Physics D, 1995, pp. 535-538, vol. 28, No. 3 (Abstract only).
Ruokamo et al., "H/sub 2/S Response of WO/sub 3/Thin-Film Sensors Manufactured by Silicon Processing Technology", Sensors and Actuators B (Chemical), 1994, pp. 486-488, vol. B19, No. 1-3 (Abstract only).
Trippe et al., "Sychrotron Beamless For X-Ray Lithography", Proceedings of the SPIE, 1994, pp. 314-319, vol. 2045 (Abstract only).
Scheckler et al., "Simulation of AZ-PN100 Resist Pattern Fluctuation in X-Ray Lithography, Including Synchrotron Beam Polarization", Japanese Journal of Applied Physics, 1993, pp. 5951-5959, vol. 32, No. 12B (Abstract only).
Schmidt et al., "Wafer Process-Induced Distortion Study for X-Ray Technology", Journal of Vacuum Science, 1991, pp. 3237-3240, vol. 9, No. 6 (Abstract only).
Wilkinson, "Dry Etch Damage and its Effect on Electronic and Optical Nanostructures", Superlattices and Microstructures, 1990, pp. 381-386, vol. 7, No. 4 (Abstract only).
Mescheder, "Investigation of Linewidth Uniformity in X-Ray Lithography", 1989, pp. 396-340, vol. 1087 (Abstract only).
Shiokawa, "Microfabrication Technologies by Focused Ion Beam", 1989, pp. 274-278, vol. 55, No. 2 (Abstract only)
Shimazu et al., "High Speed Electron Beam Lithography", Journal of the Japan Society of Precision Engineering, 1987, pp. 1682-1686, vol. 53, No. 11 (Abstract only).
Cullman, "Automatic Alignment System", Vortrage des 50. PTB Seminars Mikrometrologie Seminar, 1983, pp. 287-292 (Abstract only).

\* cited by examiner

*Primary Examiner*—John A. McPherson
(74) *Attorney, Agent, or Firm*—Saliwanchik, Lloyd & Saliwanchik

(57) ABSTRACT

The present invention relates to maskless photolithography using a patterned light generator for creating 2-D and 3-D patterns on objects using photoreactive chemicals. In an embodiment, the patterned light generator uses a micromirror array to direct pattern light on a target object. In an alternate embodiment, the patterned light generator uses a plasma display device to generate and direct patterned light onto a target object. Specifically, the invention provides a maskless photolithography system and method for creating molecular imprinted array devices, integrated microsensors and fluidic networks on a substrate, integrated circuits of conducting polymers, and patterns on substrates using photochemical vapor deposition. For creating molecular imprinted array devices, the invention provides a system and method for applying a photoreactive reagent comprising photopolymer receptors and extractable target compounds, exposing the substrate to patterned light to activate the photopolymer to form molecular imprints of the target compounds corresponding to the pattern of incident light. For creating integrated circuits of conducting polymers, the invention provides a system and method for applying a photoreactive conducting polymer reagent to a substrate, exposing the substrate to patterned light to activate the photoreactive conducting polymer reagent to form integrated circuits corresponding to the circuit pattern of incident light. In an embodiment the substrate is a photoreactive conductive polymer. For creating integrated microsensors and fluidic networks on a substrate, the invention provides a system and method for applying a photoreactive sensor creating compound and a photoreactive fluid channel creating compound to a substrate, exposing the substrate to patterned light to activate the photoreactive compounds to form microsensor arrays and fluidic networks corresponding to the pattern of incident light. For creating patterns on substrates using photochemical vapor deposition, the invention provides a system and method for exposing a substrate to photoreactive gases and patterned light to deposit chemicals on the substrate corresponding to the pattern of incident light.

10 Claims, 9 Drawing Sheets

MASKLESS PHOTOLITHOGRAPHY FOR USING PHOTOREACTIVE AGENTS

CROSS-REFERENCE TO A RELATED APPLICATION

The present application is a continuation application of U.S. patent application Ser. No. 10/179,078, filed Jun. 25, 2002 now U.S. Pat. No. 7,049,049, which claims the benefit of U.S. Provisional Application No. 60/301,218, filed Jun. 27, 2001, both of which are hereby incorporated by reference herein in their entirety, including any figures, tables, or drawings.

TECHNICAL FIELD

The present invention relates to photolithography systems and methods, specifically, to maskless photolithography devices and methods for creating microsensors and fluidic networks, molecular imprinted arrays, plastic circuits, and thin film devices.

BACKGROUND ART

Photolithography systems are known in the art that direct light beams onto a photosensitive surface covered by a mask, etching a desired pattern on the substrate corresponding to the void areas of the mask. In mask-based photolithography systems, the patterns generated are defined by physical masks placed in the path of light used for photo-activation. While effective, the use of physical masks in photolithography has numerous drawbacks, including the cost of fabricating masks, the time required to produce the sets of masks needed to fabricate semiconductors, the diffraction effects resulting from light from a light source being diffracted from opaque portions of the mask, registration errors during mask alignment for multilevel patterns, color centers formed in the mask substrate, defects in the mask, the necessity for periodic cleaning and the deterioration of the mask as a consequence of continuous cleaning.

Maskless photolithography systems are also known in the art as described in Singh-Gasson, Sangeet et al., *Nature Biotechnology* 17, 974-78, 1999. The system described in this article uses an off-axis light source coupled with a digital micromirror array to fabricate DNA chips containing probes for genes or other solid phase combinatorial chemistry to be performed in high-density microarrays.

A number of patents also exist which relate to maskless photolithography systems, including U.S. Pat. Nos. 5,870, 176; 6,060,224; 6,177,980; and 6,251,550; all of which are incorporated herein by reference.

While the previously described maskless photolithography systems address several of the problems associated with mask based photolithography systems, such as distortion and uniformity of images, problems still arise. Notably, in environments requiring rapid prototyping and limited production quantities, the advantages of maskless systems as a result of efficiencies derived from quantities of scale are not realized. Further, while maskless photolithography systems disclosed in the art are directed to semiconductor manufacture, these prior art systems and methods notably lack reference to other applications lending themselves to maskless photolithography techniques.

Photopolymers that are polymerizable when exposed to light are known in the art. Photopolymers can be applied to a substrate or objects in a liquid or semi-liquid form and then exposed to light, such as ultraviolet light, to polymerize the polymer and create solid coatings or castings. In addition, conductive photopolymers are known that exhibit electrically conductive properties, allowing creation of electric circuits by polymerizing the polymers in circuit layout patterns. However, conventional methods of photo-polymerization use physical masks to define areas of polymerization. This mask based photopolymer process suffers from the disadvantages of mask-based photolithography methods including the requisite need for many different masks, long lead time for mask creation, inability to modify masks, and the degradation of masks used in the manufacturing process.

It is known in the art to create chemical analysis arrays for gene sequencing using conventional photolithographic methods. Arrays of closely packed variations of a specific formula, or molecule, are created on a substrate to allow testing en masse for compliance with desired design specifications. Using photolithography methods, different masks are used to selectively add new molecules to an array of previously defined samples in a series of sequential exposure steps. However, because many variations of a basic molecule need to be synthesized in an array, the number of masks required to create all the desired variations on the basic molecule may require up to 100 separate masks per array. Further, the object is not to produce thousands of arrays, but just a few arrays for a specific experiment. Thus the conventional mask based manufacturing techniques are not suited to molecular array manufacture because of the need for many different masks and the limited production quantities that prohibitively impact economic advantages of quantities of scale typically realized in large production runs that help offset the high cost of physical mask production.

Photochemical vapor deposition (PCVD) is known in the art as disclosed in "Dielectric Film Deposition in Low-Pressure Photosynthesized CVD processes and Techniques;" R. L. Abber, *Handbook of Thin Film Deposition Processes and Techniques*, 1988. Typically, PCVD uses photochemical reactions to transform gaseous molecules, or precursor gases, into a solid material in the form of a thin film or powder on the surface of a substrate. Typically, the process uses ultraviolet (UV) light as a radiation source to create semiconductor devices. The process can be adapted for use in creating integrated circuits, opto-electronic devices, microsensors, catalysts, micromachines, fine metal and ceramic powders, and protective coatings, such as titanium carbide. However, conventional vapor deposition techniques require a high-vacuum deposition chamber and require heating of the substrate to enhance the deposition process, thereby limiting the application of the process to vacuum resistant and high melting point substrates.

Accordingly, there is a need in the art for a method and system for maskless photolithography to create 2-D and 3-D patterns on objects in a rapid prototyping environment. Specifically, the method and system need to provide maskless photolithography system for creating microsensors and fluidic networks devices, molecular imprinted arrays, plastic circuits, and devices using reactive techniques. This system needs to combine ease of use, reconfigurability, and the ability to eliminate the need for the use of physical masks in device manufacturing systems employing photoreactive agent processes. In summary, the system needs to provide all the advantages of a maskless photolithography system at a reasonable cost, and include capabilities tailored to specific applications.

SUMMARY OF THE INVENTION

In view of the foregoing deficiencies of the prior art, it is an object of the present invention to provide a maskless photolithography system for creating 2-D and 3-D patterns in a rapid prototyping environment using reactive processes.

It is another object of the present invention to provide a maskless photolithography system and method for creating molecular imprinted array devices.

It is still another object of the present invention to provide a maskless photolithography system and method for creating integrated microsensor and fluidic networks on a substrate.

It is yet another object of the present invention to provide a maskless photolithography system and method for creating integrated circuits of conducting polymers.

It is yet another object of the invention to provide a maskless photolithography system and method to create patterns on substrates using a photochemical vapor deposition.

To achieve these objects, a system and method are provided to create two dimensional and three dimensional structures using a maskless photolithography system that is directly reconfigurable and does not require masks, templates or stencils to create each of the planes or layers on a multi layer two dimensional or three dimensional structure. In an embodiment, the invention uses a micromirror array comprising up to several million elements to modulate light onto an object that has photoreactive compounds applied to the exposed surface or has photoreactive qualities. The desired pattern is designed and stored using conventional computer aided drawing techniques and is used to control the positioning of the individual mirrors in the micromirror array to reflect the corresponding desired pattern. Light impinging on the array is reflected to or directed away from the object to create light and dark spots on the substrate according to the pattern. The positioning information provided to the micromirror array can be modulated to cause the individual mirrors to change their angular position and duration of exposure to reduce the effects of pixelation and stiction. Alternatively, a plasma display may be used to generate and direct patterned light on an object, thereby replacing the micromirror array and separate light source and associated optics.

In the disclosed embodiments, various chemical solution application systems are provided and used in conjunction with patterned light exposure to create the desired objects. In addition, an alignment fixture, movable in three dimensions, for mounting of the object is provided. The alignment fixture allows the affixed substrate to be moved in three dimensions, providing alignment in two, coplanar dimensions and a third dimension perpendicular to the two coplanar dimensions. By providing alignment in the third dimensional direction, the invention advantageously provides the capability to produce three dimensional structures on the object.

The advantages of the invention are numerous. One significant advantage is the ability to use the invention as a reconfigurable, rapid prototyping tool for creating two-dimensional and three-dimensional micro and macroscopic objects. Another advantage of the invention is that it provides the ability to reduce prototyping costs and enable devices to be fabricated more quickly with less risk. Still another advantage of the current invention is a reduction in cost for prototyping activities realized by the elimination of physical masks. Yet another advantage of the current invention is that pattern generation can be performed optically without having to use expensive vacuum systems required by conventional mask-based photolithography. A particular advantage of the current invention is the ability to create molecular imprinted arrays, conductive polymer integrated circuits, and fluidic channel and microsensor arrays in a rapid, reconfigurable process by employing a maskless pattern in conjunction with conventional reagent application processes. Still yet another advantage of the current invention is the capability of creating patterns on substrates exposed to patterned light in a vapor deposition chamber without having to use degradable masks or high heat conditions. Still another advantage of the current invention is the ability to create three-dimensional devices using an alignment stage to selectively expose successive layers in a substrate. By modulating the movement and duration of movement of the micromirror arrays, the negative effects of pixelation and stiction of micromirrors are reduced.

All patents, patent applications, provisional applications, and publications referred to or cited herein, or from which a claim for benefit of priority has been made, are incorporated herein by reference in their entirety to the extent they are not inconsistent with the explicit teachings of this specification.

Other aspects and advantages of the invention will become apparent from the following detailed description taken in conjunction with the accompanying drawings, illustrating, by way of example, the principles of the invention.

BRIEF DESCRIPTION OF THE DRAWINGS

In order that the manner in which the above recited and other advantages and objects of the invention are obtained, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

Figure 1A:
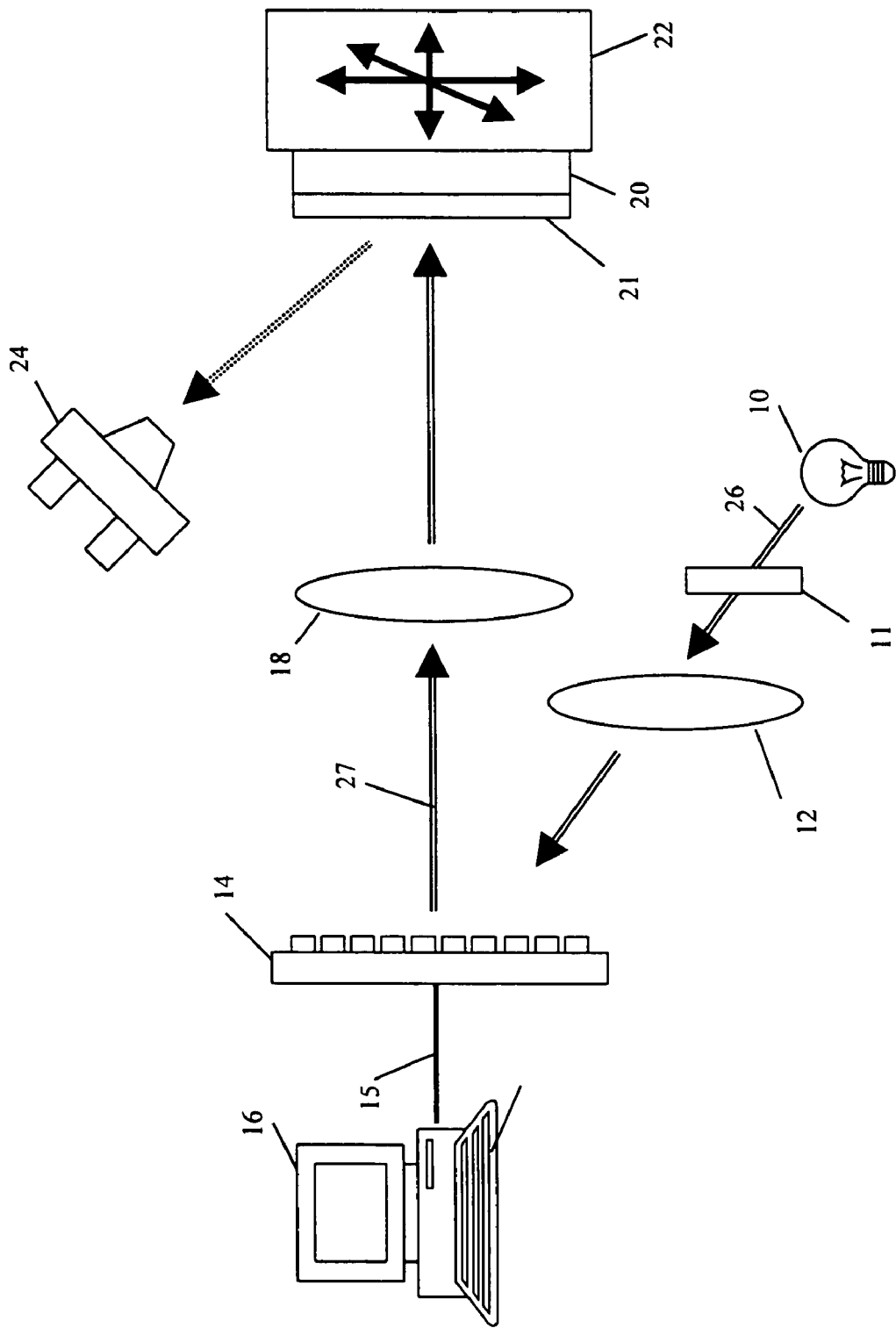
FIG. 1A illustrates a maskless photolithography system.

It should be understood that in certain situations for reasons of computational efficiency or ease of maintenance, the ordering and relationships of the blocks of the illustrated flow charts could be rearranged or re-associated by one skilled in the art. While the present invention will be described with reference to the details of the embodiments of the invention shown in the drawings, these details are not intended to limit the scope of the invention.

DETAILED DISCLOSURE OF THE INVENTION

Reference will now be made in detail to the embodiments consistent with the invention, examples of which are illustrated in the accompanying drawings. First, briefly, the invention is a system and method to create two dimensional and three dimensional structures using a maskless photolithography system that is directly reconfigurable and does not require masks, templates or stencils to create each of the planes or layers on a multi layer two dimensional or three dimensional structure. Specifically, the invention provides a system and method for creating molecular imprinted arrays, integrated circuits of conductive polymers, microsensors and fluidic networks devices, and patterns on substrates using photochemical vapor deposition techniques.

The invention uses a patterned light generator to create a patterned light beam corresponding to a desired mask pattern. Specifically, the invention uses a micromirror array comprising up to several million elements to modulate light onto a substrate that has photoreactive or photoresist compounds applied to the exposed surface. The desired pattern is designed and stored using conventional computer aided drawing techniques and is used to control the positioning of the individual mirrors in the micromirror array to reflect the corresponding desired pattern. Light impinging on the array is reflected to or directed away from the substrate to create light and dark spots on the substrate according to the desired pattern. In addition, an alignment fixture for mounting of the substrate allows the substrate to be moved in three dimensions, providing alignment in two, coplanar dimensions and the capability to produce three dimensional structures by aligning the substrate in a third dimension perpendicular to the two coplanar dimensions.

I. Maskless Photolithography

Referring now to FIG. 1, a maskless lithography system includes a light source 10, a removable filter 11, a first lens system 12, a micromirror array 14, a computer system 16, a second lens system 18, a substrate 20, mounted on a movable alignment fixture 22, and an optical viewer 24. A layer of photoreactive chemicals 21 is disposed on the substrate 20.

As shown, light source 10 provides a beam of collimated light, or light beam 26, which can be selectively filtered by inserting or removing filter 11 from light beam 26. Alternatively, or in addition, a filter 11 can be placed in a patterned light beam 27 reflected from said micromirror array 14. Light beam 26 is projected upon first lens system 12 and then onto micromirror array 14, wherein each mirror in the micromirror array corresponds to a pixel of the mask pattern. Micromirror array 14 is controlled by computer system 16 over signal line(s) 15 to reflect light in the patterned light beam 27 according to a desired mask pattern stored in memory.

In addition, computer system 16 can optionally shift the desired mask pattern in two dimensions to align the pattern with the substrate 20 mounted on movable alignment fixture 22. Precise pattern alignments are made electronically by shifting the mask pattern information provided to the micromirror array such that the image reflected to the substrate is translated to correct for misalignment. For example, if the mask pattern needs to be shifted to the right one pixel width to be properly aligned on the substrate, the computer compensates for the misalignment by shifting the mask pattern one pixel width to the right.

Micromirror array 14 is controlled to modulate the positioning and duration of exposure of the mirror to prevent stiction and pixelation. The individual mirrors of micromirror array 14 are driven to vary their angular orientation with respect to on-axis illumination during exposure of a substrate. After being reflected in a desired pattern from micromirror array 14, patterned light beam 27 passes through second lens system 18, and impinges on a layer of photoreactive chemicals 21 applied to substrate 20, thereby creating a pattern on substrate 20 by producing a reaction between the layer of photoreactive chemicals 21 and substrate 20. Alternatively, a photoresist chemical could be applied to substrate 20 to etch areas of substrate 20 not masked off by the mask pattern during an exposure.

The mask pattern described above is a programmable mask pattern generated with the use of computer aided design and is resident on computer system 16. Accordingly, the mask pattern to be transferred to the layer of photoreactive chemicals 21 and substrate 20 is a selectively programmable mask pattern. Thus, with a programmable mask pattern, any portion of the pattern on the substrate 20 can be manipulated and/or changed as desired for rendering of desired changes as may be needed, furthermore, on a significantly reduced cycle time.

Micromirror array 14 described above is a micro mirror device known in the art. With the micro mirror device, light is reflected according to a pattern of pixels as controlled according to a prescribed pixel/bit mask pattern received from computer system 16. The light reflecting from the micro mirror device thus contains the desired mask pattern information. A micro mirror device may include any suitable light valve, for example, such as that used in projection television systems and which are commercially available. Light valves are also referred to as deformable mirror devices or digital mirror devices (DMD). One example of a DMD is illustrated in U.S. Pat. No. 5,079,544 and patents referenced therein, in which the light valve consists of an array of tiny movable mirror-like pixels for deflecting a beam of light either to a display screen (ON) or away from the display optics (OFF). The pixels of the light valve device are also capable of being switched very rapidly. Thus, with the use of the light valve, the photolithography system of the present disclosure can implement changes in the mask pattern in a relatively quick manner. The light valve is used to modulate light in accordance with a mask pattern information provided by the computer system 16. In addition, the DMD reflects light, thus no appreciable loss in intensity occurs when the patterned light is projected upon the desired subject during the photolithographic, patterned light exposure.

The positioning of the individual micromirrors in the micromirror array can be modulated slightly while positioned in a desired mask pattern. By slightly changing the position and duration of exposure of the mirrors while exposing a substrate, the effects of pixelation on the exposed substrate and stiction of the mirrors can be reduced. The duty cycle of the modulation command can be selectively modified to achieve an optimum ratio between on axis, direct exposure, and off axis, indirect exposure. As a result, the micromirrors are constantly moving to prevent stiction, and further allow integration of inter-pixel exposure areas to provide uniform coverage of the mask pattern to eliminate pixelation.

Advantageously, images are optionally shifted electronically to provide fine alignment of the pattern on substrate 20. The mask pattern is digitally shifted according to alignment information in one or more directions for achieving a desired mask alignment on substrate 20. Adjustments in alignment are carried out electronically in the mask bit pattern information provided to the light valve. As a result, fine adjustments in pattern alignment can be easily accomplished.

Movable alignment fixture 22, in conjunction with optical viewer 24, provides the capability to initially align substrate 20 under patterned light beam 27 using mechanical alignment mechanisms (not shown) to align substrate 20 in three dimensions. The mechanical alignment system may include gears, pulleys, belts, chains, rods, screws, hydraulics, pneumatics, piezo motion or combinations thereof as known in the art to support and move an object in three dimensions. While performing alignment procedures, filter 11 is inserted in light beam 26 to filter out the wavelengths of light that react with the layer of photoreactive chemicals 21 on substrate 20. Optical viewer 24, provides a means to monitor the positioning of substrate during manual alignment. While providing alignment in coplanar first and second dimensions, alignment fixture 22 advantageously provides alignment in a direction perpendicular to the coplanar first and second dimensions, allowing fabrication of three dimensional objects. For example, to gain more control over sidewall profiles or to produce complicated structures, multiple layers of substrate 20 can be sequentially exposed by aligning substrate 20 in the third dimension to create three dimensional features. Coupled with computer controlled alignment of the desired pattern, the invention provides the capability to quickly manually align substrate 20 under patterned light beam 27 and allows computer system 16 to automatically finely tune the alignment before exposing layer of photoreactive chemicals 21 on substrate 20.

Figure 1B:
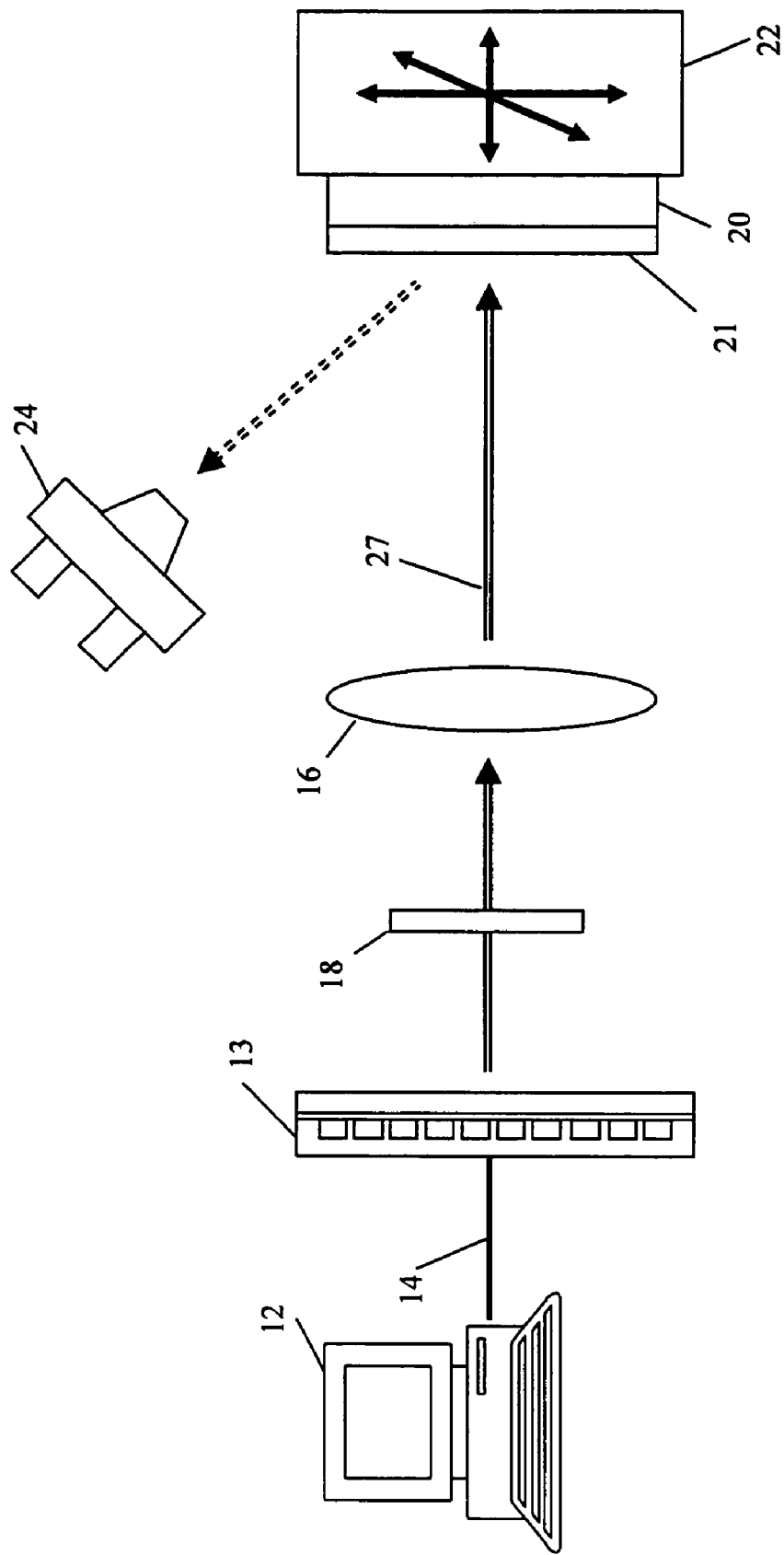
FIG. 1B illustrates a maskless photolithography system using a plasma display.

In an alternative embodiment shown in FIG. 1B, a plasma display device 13 can be substituted for the micromirror array 14, light source 10 and associated optics of FIG. 1A. Referring now to FIG. 1B, an embodiment of the current invention includes a plasma display device 13, a computer system 16, a removable filter 11, a lens system 18, a substrate 20, mounted on a movable alignment fixture 22, and an optical viewer 24. A layer of photoreactive chemicals 21 is disposed on the substrate 20. As shown, plasma display device 13 generates a beam of light, or patterned light beam 27, wherein each pixel of the plasma display 13 corresponds to a pixel of the mask pattern. Plasma display device 13 is controlled by computer system 16 over signal line(s) 15 to generate light according to a desired mask pattern stored in memory. In addition, computer system 16 can shift the desired mask pattern in two dimensions to align the pattern with the substrate 20 mounted on movable alignment fixture 22. Precise pattern alignments are made by optionally electronically shifting the mask pattern information provided to the plasma display device 13 such that the image directed to the substrate is translated to correct for misalignment. For example, if the mask pattern needs to be shifted to the right one pixel width to be properly aligned on the substrate, the computer compensates for the misalignment by shifting the mask pattern one pixel width to the right.

The patterned light beam radiated from plasma display device 13 can be selectively filtered by inserting or removing filter 11 from patterned light beam 27. Filtering can take place at any point along the light beam path to prevent exposure during alignment. A lens system 18 can collimate and condition the light beam as desired. After passing through lens system 18, patterned light beam 27 impinges on a layer of photoreactive chemicals 21 applied to substrate 20, thereby creating a pattern on substrate 20 by producing a reaction between the layer of photoreactive chemicals 21 and substrate 20. Alternatively, a photoresist chemical could be applied to substrate 20 to etch areas of substrate 20 not masked off by the mask pattern during an exposure.

Figure 2:
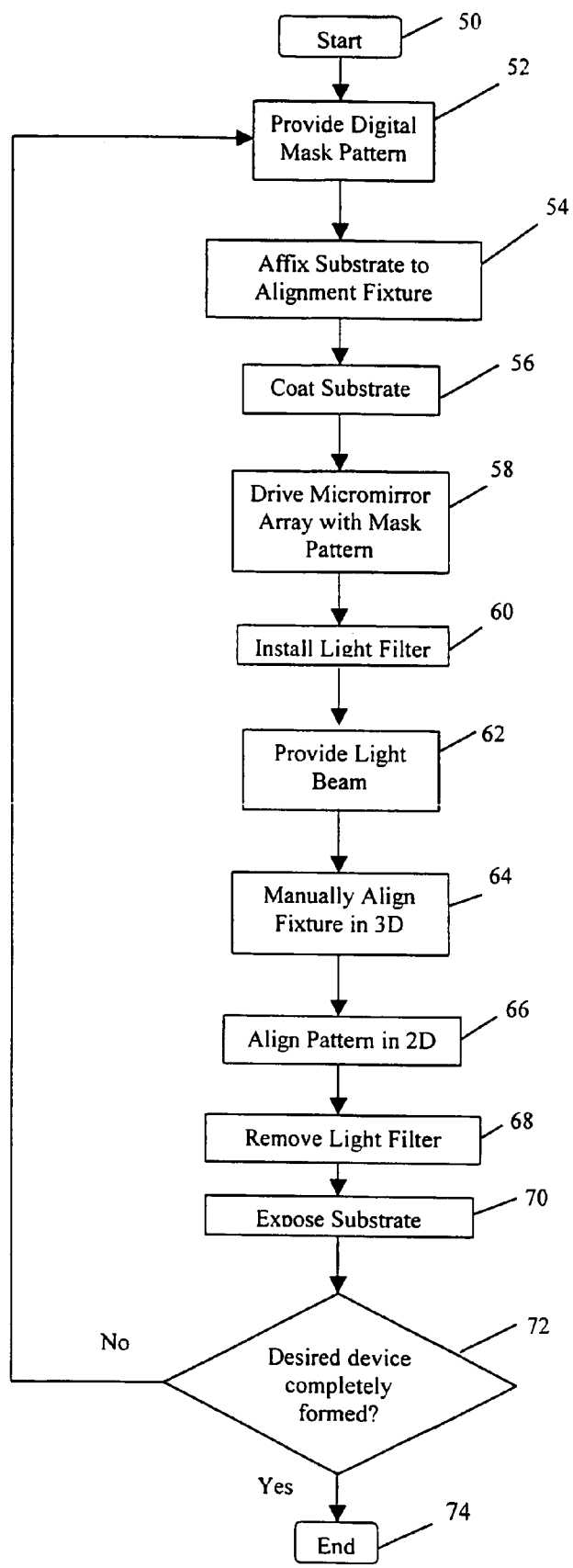
FIG. 2 is a flow chart illustrating a maskless photolithography method.

Referring now to FIG. 2, a method of using the maskless photolithography system described above will now be explained. It should be understood that in certain situations for reasons of computational efficiency or ease of maintenance, the ordering and relationships of the blocks of the illustrated flow charts could be rearranged or re-associated by one skilled in the art. Starting from step 50, a desired mask pattern is designed and stored on computer system 16 in step 52. Alternatively, mask pattern designs can be designed on other computer systems and imported into computer system 16. Next, in step 54, a substrate 20 is placed on alignment fixture 22 and coated with a layer of photoreactive chemicals 21 in step 56.

Once the substrate is mounted in alignment fixture 22, the filter 11 is placed in the light beam 26 path according to step 58 to filter the light and prevent exposure of the substrate. Next, the computer system 16 can then be instructed to provide the resident mask pattern information to micromirror array 14 as shown in step 60, and the micromirror array 14 responds by orienting each individual mirror to reflect or direct light beam 26 away from substrate 20 according to the desired pattern. Next, alignment of the substrate is enabled by exciting the light source 10 to provide a light beam in step 62, projecting light beam 26 through first lens system 12, and then onto micromirror array 14. In turn, micromirror array 14 reflects light beam 26 through second lens system 18 and onto layer of photoreactive chemicals 21 and substrate 20.

With the desired pattern projected on substrate 20, alignment fixture 22 can be manually aligned in three dimensions according to step 64 by moving alignment fixture 22 to ensure that substrate 20 is properly located in patterned light beam 27. Proper alignment is verified by viewing the projected pattern on substrate 20 through optical viewer 24. Once substrate 20 is manually aligned, alignment information is optionally provided to computer system 16 and computer system 16 automatically adjusts the micromirror 14 by shifting the pattern in two dimensions to attain proper alignment in step 66. Having aligned substrate 20, the layer of photoreactive chemicals 21 on substrate 20 is exposed in step 70 by removing filter 11 from light beam 26 in step 68 and allowing the light to cause a reaction between layer of photoreactive chemicals 21 and substrate 20 for a required reaction time depending on the photoreactive chemicals used. For example, using standard Novolac™ positive photoresist, an exposure time of 60 seconds is used. In an embodiment, during exposure step 70, the angular position of the mirrors in micromirror array 14 is varied slightly according to commands from computer system 16. For example, when masking a 25 micron square feature, the angular position of the mirrors in micromirror array 14 might be varied so that the mask effectively covers an area of 36 microns square, centered on the desired 25 micron square feature. As a further example, the duty cycle for the angular deflection could be adjusted so that the 25 micron square feature is masked 90% of the total exposure time and the remaining 11 square micron area is covered 10% of the total exposure time. By modulating the position and duration of exposure of the mirrors as described, stiction of the mirrors is reduced. Further, pixelation effects on the substrate are reduced by providing mask pattern coverage of the interpixel areas not covered by direct, on axis illumination.

If further exposures are desired in step 72, such as required when creating three-dimensional objects, the above method is repeated by returning to step 52 until the desired object is fabricated. A new digital mask pattern is provided, another photoreactive coat is applied, and the substrate is realigned and re-exposed. Once the desired object has been created, the process ends in step 74.

An example of the current invention using the system and method described above will now be presented. A maskless photography system is especially adapted to be an integrated, reconfigurable, rapid prototyping is described. The system provides optics, a light source, and integrated electronic components used to directly generate patterns for the exposure of photoresist and other photoimagable materials. A broadband spectrum, high intensity white light source provides the exposure energy for the process. This light is then filtered and optimized for the exposure process, using a variety of integrated optical components. A direct-coupled optical delivery system ensures efficient transfer of the light energy. Using proven optical techniques, the projected image is free of distortion and uniform throughout the exposure area. With the optimized optical stream, the image is imposed in the light path, providing the final exposure pattern. This pattern is then transferred to the substrate surface and used to expose the photo-sensitive material required in the user's fabrication process.

A personal computer is operably connected to a micromirror array to provide mask patterns. The mask patterns are generated in the computer and then transferred to the micromirror array to provide the optical pattern for exposure. The pattern is transferred to a substrate and is observed using an optical microscope. This microscope is used for pattern alignment to the substrate. Alignment is controlled through the use of a course alignment stage provided by a mechanically movable substrate mounting alignment fixture, combined with a fine, electronic alignment stage. This fine alignment stage is computer controlled and aligns the mask pattern reflected from the micromirror instead of moving the alignment fixture, thereby offering exceptional accuracy and repeatability. Once alignment is complete, substrate exposure occurs. Through the use of a step and repeat method, the entire substrate surface can be exposed and multiple layers can be created using an alignment stage movable in a direction parallel to the light beam.

In addition, according the invention, three-dimensional patterns can be created using the three dimension alignment capabilities disclosed above, for example, patterning using thick photo resist or multi-layer patterning of individual photoresist layers. These techniques can be used to provide either a photomask for subsequent etching of substrate materials or if the photopolymer is compatible with the chemistry used in the device, the fabricated features can be used as part of the device itself.

The system described above can be adapted for use in novel environments, advantageously incorporating the disclosed maskless photolithography system. Specifically, a system and method of maskless photolithography can be used to create molecular imprinted array devices, integrated microsensors and fluidic networks on a substrate, integrated circuits of conducting polymers, and thin film devices using a chemical vapor deposition as described below.

II. Maskless Photolithography for Creating Molecular Imprinted Array Devices.

Figure 3A:
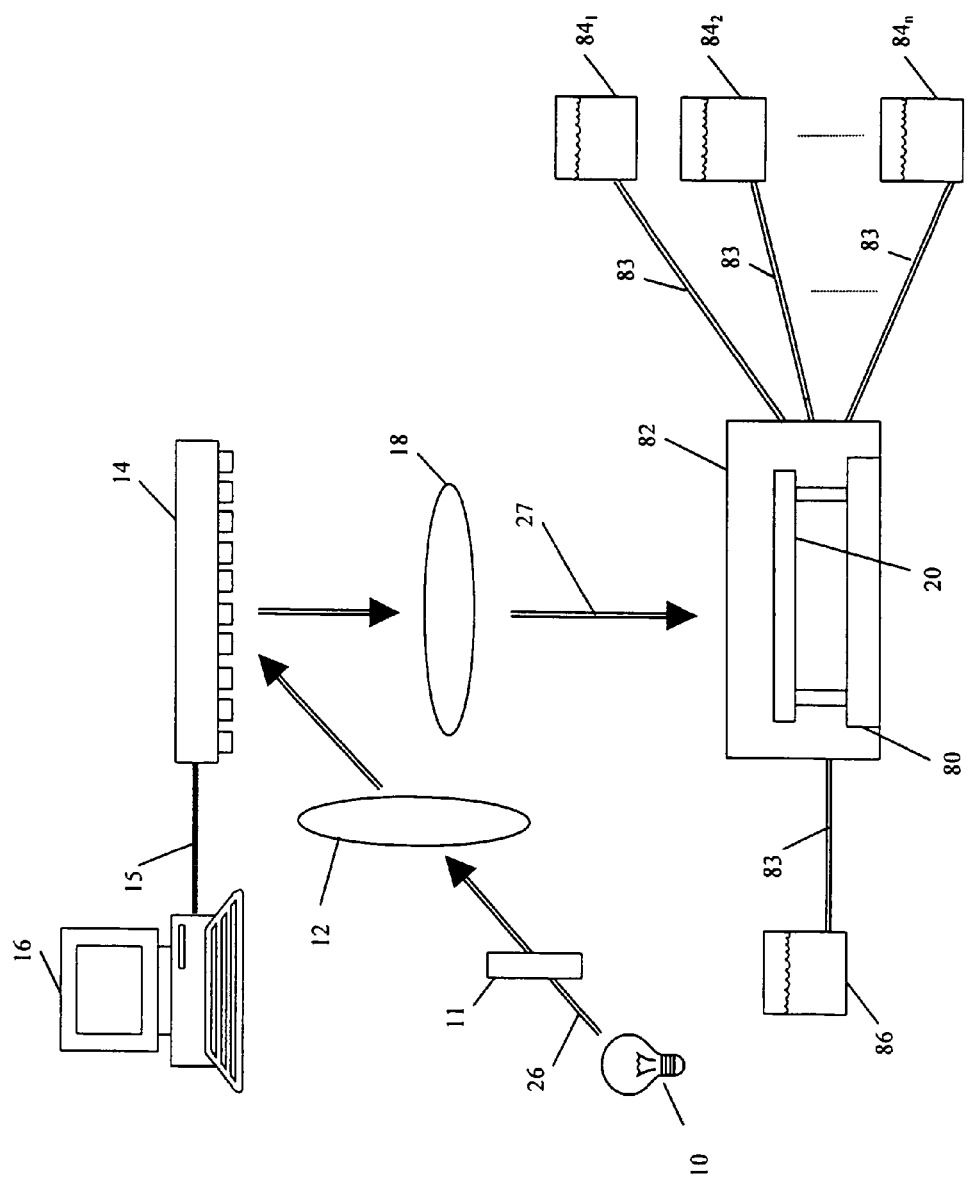
FIG. 3A illustrates a maskless photolithography system for creating molecular imprinted array devices.

Referring now to FIG. 3A, an embodiment of the current invention for creating molecular imprinted array devices is depicted. In the embodiment, a maskless photolithography system is combined with a chemical reaction chamber adapted to sequentially introduce reagents and photoreactive compounds onto a substrate to create a microsensor array providing molecular recognition capabilities. Recognition sites generated on the substrate subject to photoreactive compounds are defined by the patterned light radiated by the maskless photolithography system.

As shown in FIG. 3A, a maskless lithography system for creating molecular imprinted array devices includes a light source 10, a removable filter 11, a first lens system 12, a micromirror array 14, a computer system 16, a second lens system 18, and a substrate 20, affixed to a mount 80, in a reaction chamber 82, which is in selectable fluid communication via fluid lines 83 with a plurality of reservoirs $84_1$, $84_2$ ... $84_n$, containing reagents, and with a wash solution 86. According to the present embodiment, the substrate 20 comprises a photoreactive compound, such as a photopolymer, that reacts with light to form patterns on the substrate 20 when activated by the reagents. In alternative embodiments, a movable alignment fixture 22 upon which the reaction chamber 82 is mounted, and an optical viewer 24 are provided as depicted in FIG. 1A.

After being reflected in a desired pattern from micromirror array 14, patterned light beam 27 passes through second lens system 18, and impinges the substrate 20, thereby creating a light pattern on the substrate 20 mounted in the reaction chamber 82. By illuminating the polymer substrate 20, the patterned light beam 27 activates a reaction between a reagent, comprising a photoreactive compound, such as a photopolymer selectively introduced via a fluid line 83, and a guest molecule introduced by another fluid line 83 on the substrate 20. The reaction creates receptor (host) sites filled with guest molecules corresponding to the incident patterned light beam 27 on the substrate 20. The guest molecules are then washed or extracted away by selectively providing a wash solution from the wash bath 86 via the fluid line 83. This process creates recognition sites that serve as microsensor sites or recognition systems. In an alternative embodiment, fluid lines 83 further comprise valves (not shown) operably connected to the fluid lines 83 for selectively controlling the application of reagents and wash solution. In a further embodiment, the valves are controlled by the computer system 16 for automatically sequencing the steps of reagent application, patterned light exposure, and washing.

By sequentially introducing reagents and wash solution via fluid lines 83, an array of imprinted recognition sites can be sequentially created on the substrate 20. The recognition sites created on the substrate 20 act as chemically selective binding sites which recognize specific molecules, corresponding to the design of the site, when solutions are applied to the array. The inventive technique creates plastic receptor sites that can "grab" specific chemicals and that act as artificial receptors for the chemicals. When an unknown sample is applied to a created substrate 20 having imprinted recognition sites, a transducer, such as a fluorescent dye, can be used to allow identification of the presence of a targeted chemical in the unknown sample.

Figure 3B:
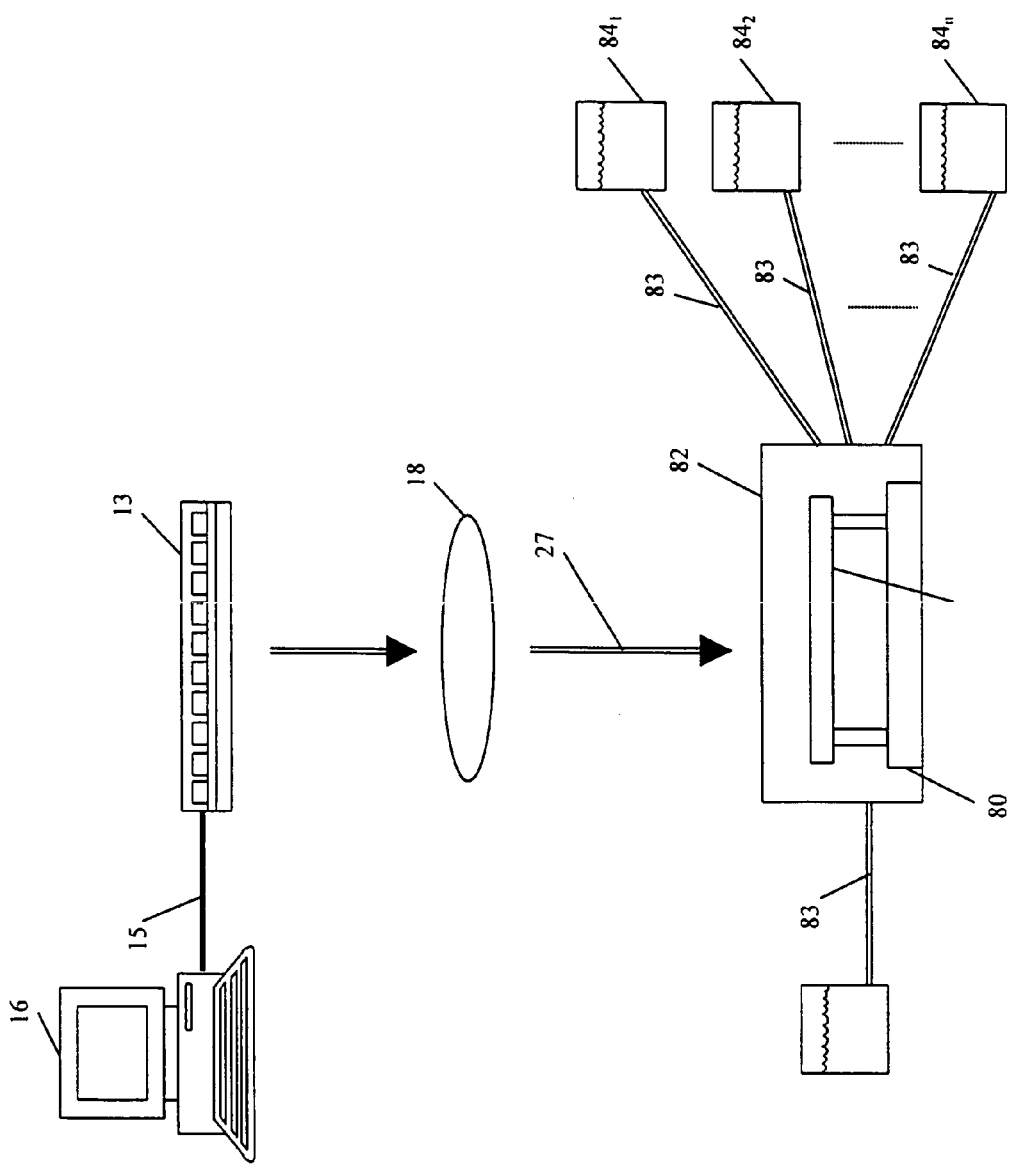
FIG. 3B illustrates a maskless photolithography system for creating molecular imprinted array devices using a plasma display.

In an alternate embodiment, a plasma display device 13 can be substituted for the micromirror array 14, light source 10 and associated optics as previously described and shown in FIG. 3B. Thus, the light source and patterning system can be combined in an integrated plasma display device 13 to directly radiate a patterned light beam 27.

III. Maskless Photolithography for Creating Integrated Circuits of Conducting Polymers Referring again to FIG. 3A, an embodiment of the current invention for creating integrated circuits of conducting polymers will be described. In an embodiment, a maskless photolithography system is used to radiate a circuit pattern and induce polymerization in a polymerizable film according to a radiated light pattern. In an alternative embodiment, chemical amplification strategies using a chemical reactor cell, comprising reagent reservoirs to allow stepwise introduction of photoreactive compounds, are used in combination with a maskless photolithography system to create plastic integrated circuits. Circuit patterns generated on the substrate by the photoreactive compounds are defined by the patterned light radiated by the maskless photolithography system.

As shown in FIG. 3A, a maskless lithography system for creating integrated circuits of conducting polymers using chemical amplification includes a light source 10, a removable filter 11, a first lens system 12, a micromirror array 14, a computer system 16, a second lens system 18, and a substrate 20, affixed to a mount 80, in a reaction chamber 82, which is in selectable fluid communication via of fluid lines 83 with a plurality of reservoirs $84_1, 84_2 \ldots 84_n$ containing reagents, and with a wash bath 86. According to an embodiment, the substrate 20 comprises a thin film of conductive polymer, preferably polymerizable under light irradiation, which reacts with light to form patterns on the substrate 20. Alternatively, the polymer is an electrically conductive, photoreactive conjugated polymer, such as polyakylthiophene. In an embodiment using chemical amplification, insoluble regions are formed on the polymer substrate 20 when activated by the reagents and exposed to light. In yet other alternative embodiments, a movable alignment fixture 22 upon which the reaction chamber 82 is mounted, and an optical viewer 24 are provided as depicted in FIG. 1A.

As shown in FIG. 3A, light source 10 provides a beam of light, or light beam 26, which can be selectively filtered by inserting or removing filter 11 from light beam 26. Light beam 26 is projected upon first lens system 12 and then onto micromirror array 14, wherein each mirror in the micromirror array corresponds to a pixel of the mask pattern. Micromirror array 14 is controlled by computer system 16 over signal line(s) 15 to reflect light according to a desired mask pattern stored in memory. In addition, computer system 16 can shift the desired mask pattern in two dimensions to align the pattern with the substrate 20.

After being reflected in a desired pattern from micromirror array 14, patterned light beam 27 passes through second lens system 18, and impinges the substrate 20, thereby creating a light pattern on the substrate 20 mounted in the reaction chamber 82. By illuminating the substrate 20, the patterned light beam 27 activates a reaction between a photoreactive reagent, for example a photoreactive, electrically conductive polymer, selectively introduced via a fluid line 83 onto the exposed substrate 20. The reaction creates insoluble regions of conducting polymers, resulting in photolithography defined patterns on the substrate 20 corresponding to the incident patterned light beam 27. The reagent is then washed or extracted away by selectively providing a wash solution from the wash bath 86 via the fluid line 83. By sequentially introducing reagents and wash solution via fluid lines 83, a plastic circuit is sequentially created on the substrate 20.

In an alternative embodiment, fluid lines 83 further comprise valves (not shown) operably connected to the fluid lines 83 for selectively controlling the application of reagents and wash solution. In a further embodiment, the valves are controlled by the computer system 16 for automatically sequencing the steps of reagent application, patterned light exposure, and washing. In yet another embodiment, a plasma display device 13 can be substituted for the micromirror array 14, light source 10 and associated optics as previously described and shown in FIG. 3B. Thus, the light source and patterning system can be combined in an integrated plasma display device 13 to directly radiate a patterned light beam 27.

Because the patterned light 27 is computer controlled, the generated mask patterns can be quickly and easily modified to allow rapid prototyping of plastic conductors.

IV. Maskless Photolithography for Creating Integrated Microsensors and Fluidic Networks on a Substrate.

Figure 4A:
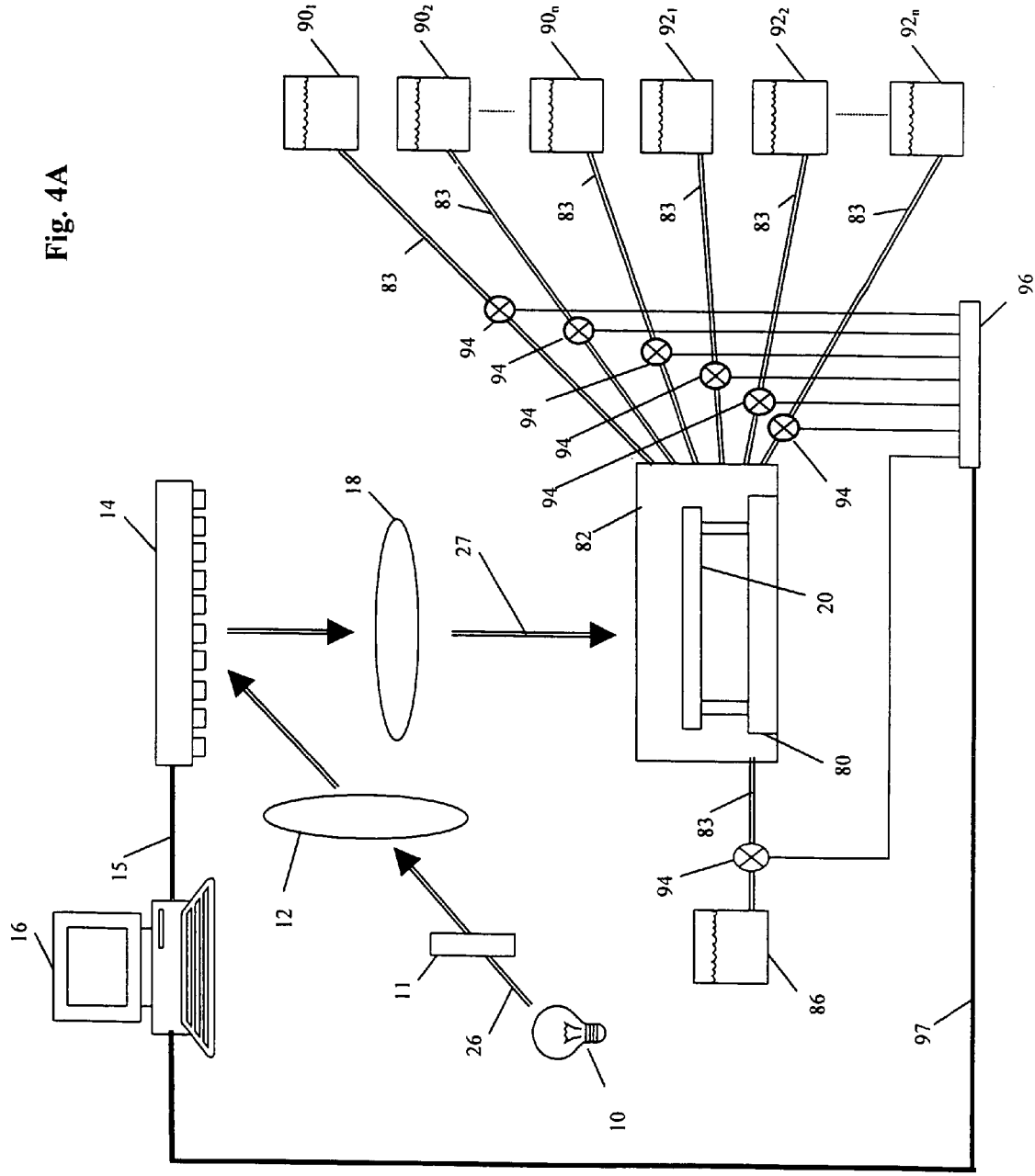
FIG. 4A illustrates a maskless photolithography system for creating integrated microsensors and fluidic networks.

Referring now to FIG. 4A, an embodiment of the current invention for creating integrated microsensor and fluidic networks on a substrate is depicted. In the embodiment, a maskless photolithography system is combined with an automated chemical delivery system to create a mosaic of microsensor regions connected to a network of fluid delivery lines to create microsensor array devices. A chemical dispensing subsystem is adapted to sequentially introduce photoreactive chemicals onto a substrate mounted in a reaction chamber to embed fluid channels and fluid networks in distributed microsensor zones to create an integrated microsensor on a substrate exposed to patterned light.

As shown in FIG. 4A, a maskless lithography system for creating integrated microsensors and fluidic networks on a substrate using chemical amplification includes a light source 10, a removable filter 11, a first lens system 12, a micromirror array 14, a computer system 16, a second lens system 18, and a substrate 20, affixed to a mount 80, in a reaction chamber 82. To provide the chemical agents, a plurality of microsensor creating compounds, such as photoreactive chemical linkers, are contained in a plurality of microsensor compound reservoirs $90_1, 90_2 \ldots 90_n$, and a plurality of fluid channel structure creating compounds, such as photopolymers, are contained in a plurality of fluid channel compound reservoirs $92_1, 92_2 \ldots 92_n$. In addition, a wash solution is contained in a wash reservoir 86. Each reservoir is connected to the reaction chamber 82 by fluid lines 83 having valves 94 controlled via a valve controller 96 operably connected to and controlled by computer system 16 over interface connection 97. According to an embodiment, a compound is selectively applied to the substrate 20, the substrate is exposed to patterned light, and then the substrate 20 is cleaned using a wash solution to allow additional application of compounds and light exposure. Molecular microsensor regions are thus created by the photoreactive linkers where illuminated by the patterned light. Similarly, insoluble fluid channel regions are formed on the substrate 20 when activated by the photoreactive fluid channel compounds and exposed to light. The process of photoreactive compound application, exposure, and washing is repeated until the desired microsensor and fluidic channel network array is created. In alternative embodiments, a movable alignment fixture 22, upon which the reaction chamber 82 is mounted, and an optical viewer 24 are provided as depicted in FIG. 1A.

As shown in FIG. 4A, light source 10 provides a beam of light, or light beam 26, which can be selectively filtered by inserting or removing filter 11 from light beam 26. Light beam 26 is projected upon first lens system 12 and then onto micromirror array 14, wherein each mirror in the micromirror array corresponds to a pixel of the mask pattern. Micromirror array 14 is controlled by computer system 16 over signal line(s) 15 to reflect light according to a desired mask pattern stored in memory. In addition, computer system 16 can shift the desired mask pattern in two dimensions to align the pattern with the substrate 20.

After being reflected in a desired pattern from micromirror array 14, patterned light beam 27 passes through second lens system 18, and impinges the substrate 20, thereby creating a light pattern on the substrate 20 mounted in the reaction chamber 82. By illuminating the substrate 20, the patterned light beam 27 activates a reaction between a compound selectively introduced via a fluid line 83 onto the exposed substrate 20. The reaction creates insoluble regions of polymers, resulting in photolithography defined patterns on the substrate 20 corresponding to the incident patterned light beam 27.

The reagent is then washed or extracted away by selectively providing a wash solution from the wash solution reservoir 86 via the fluid line 83. Specifically, microsensors are created by sequentially introducing compounds from the microsensor reservoirs $90_1, 90_2 \ldots 90_n$, and wash solution via fluid lines 83. Similarly, by sequentially introducing compounds from the fluid channel reservoirs $92_1, 92_2 \ldots 92_n$, and wash solution via fluid lines 83, fluid channels connected to microsensors on the substrate 20 are created. Because the patterned light 27 is computer controlled, the generated mask patterns can be quickly and easily modified to allow rapid prototyping and creation of integrated microsensors and fluidic networks on a substrate.

Figure 4B:
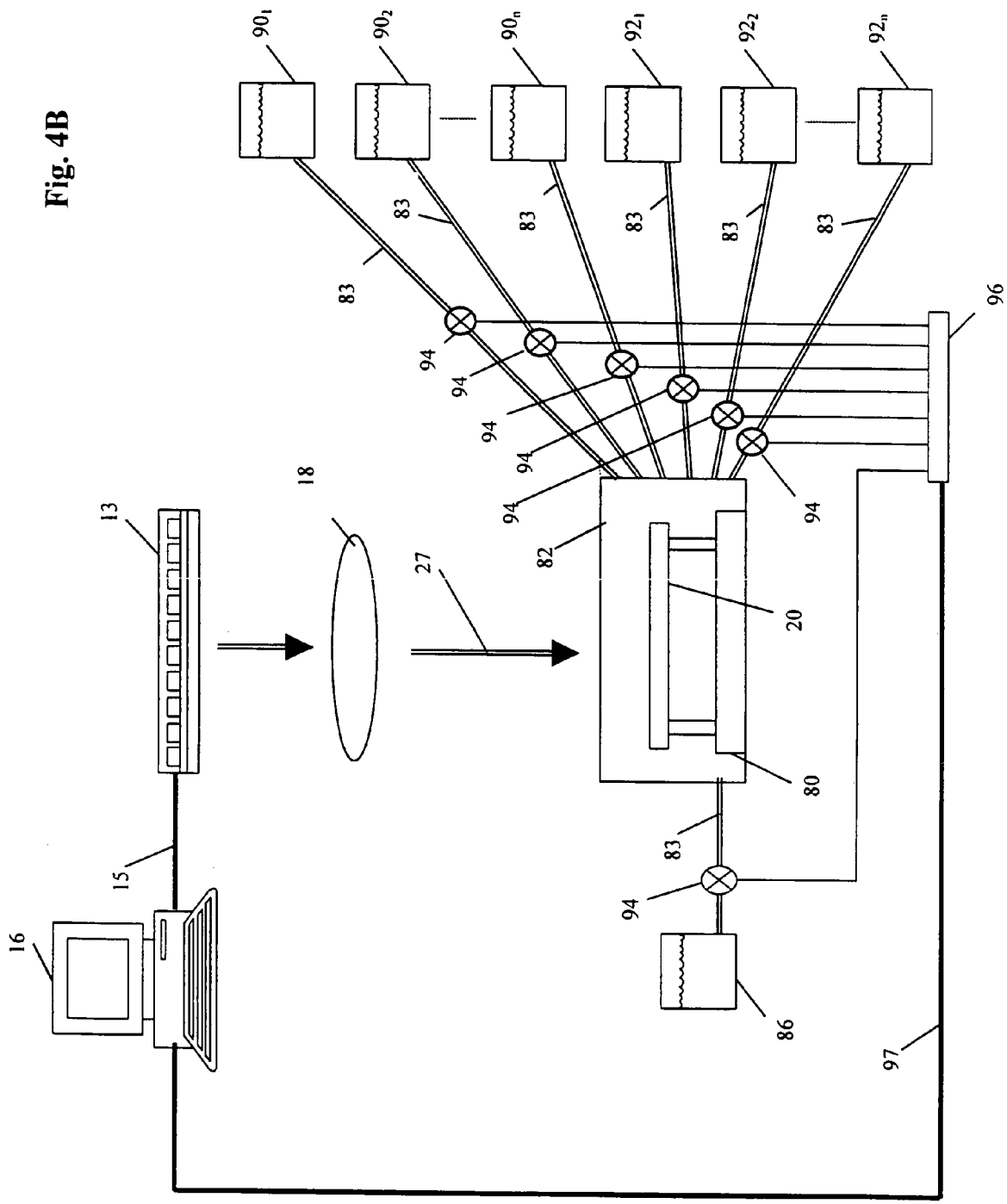
FIG. 4B illustrates a maskless photolithography system for creating integrated microsensors and fluidic networks using a plasma display.

In an alternate embodiment, a plasma display device 13 can be substituted for the micromirror array 14, light source 10 and associated optics as shown in FIG. 4B. Thus, the light source and patterning system can be combined in an integrated plasma display device 13 to directly radiate a patterned light beam 27.

In an example, the above described system and method can be used to create nucleic acid or protein microarrays for detecting biological organisms or biological conditions. The nucleic acid or protein microarrays can be used to quickly and efficiently detect organisms in a clinical or environmental setting, with the potential for determining the presence of an organism. As known in the art, gene sequences for the detection of specific nucleic acid or protein sensor molecules can be created to aid in the identification of certain proteins or molecules in a sample. In the present invention, the appropriate probes for identifying organisms are prepared according to commonly known methods. The probes are then covalently linked linker chemistries known in the art. For example, the resulting probe/linker combination is attached to a solid surface using an attaching linker, such as a photo-activated cross-linking agent.

In a specific example of the above described nucleic acid microarray, the invention can be used to create nucleic acid microarrays for detecting pathogenic viruses, such as enteroviruses. The nucleic acid microarrays can be used to quickly and efficiently detect pathogenic viruses in a clinical or environmental setting, with the potential for determining a pollution level and a presence of dangerous conditions for human or other life. As known in the art, gene sequences for the detection of specific nucleic acid molecules can be created to aid in the identification of certain proteins or molecules in a sample. In the present invention, the appropriate gene sequences, or nucleotide probes for identifying enteroviruses are prepared according to commonly known methods. The nucleotide probes are then covalently linked to a sulfosuccinimidyl (perflouroazidogenzamido) ethyl-1,3 dithiopropionate linker. The resulting probe/linker combination can then be attached to a solid surface using an attaching linker, such as a photo-activated cross-linking agent. In the current example, a 3-aminopropyltriethoxysiline linker is used to link the nucleotide-probe to a substrate.

To create the microarray, microsensor regions to detect a specific molecule are created using a maskless pattern generator to activate the cross-linking agent in areas corresponding to a desired pattern. A substrate 20 is installed in the reaction chamber 82 and coated with the 3-aminopropyltriethooxysiline linker from one of the microsensor compound reservoirs 90. Next, sensor molecule is introduced via another microsensor compound reservoir 90 and the substrate is exposed to the patterned light beam 27 to photo-affix the probes to substrate 20. The probes are spatially arranged on the substrate, with the wash agents being applied via the wash reservoir 86 after each probe layer or pattern is affixed. Fluid channels, connected to the created microsensor regions, are built up by applying a photoreactive polymer from a fluid channel reservoir 92 and exposing the fluid photoreactive polymer coated substrate to the patterned light beam 27 to create fluid channels, connecting to the microsensor regions on the substrate. This process is repeated until the desired fluid interconnecting channels have been created. If desired, the substrate can be washed between each application and exposure of photoreactive polymers or as needed. The microsensor array chips created using the above described system and method can be advantageously used to quickly create arrays to detect biological organisms or conditions.

V. Maskless Photolithography using Chemical Vapor Deposition to Create Devices

Figure 5A:
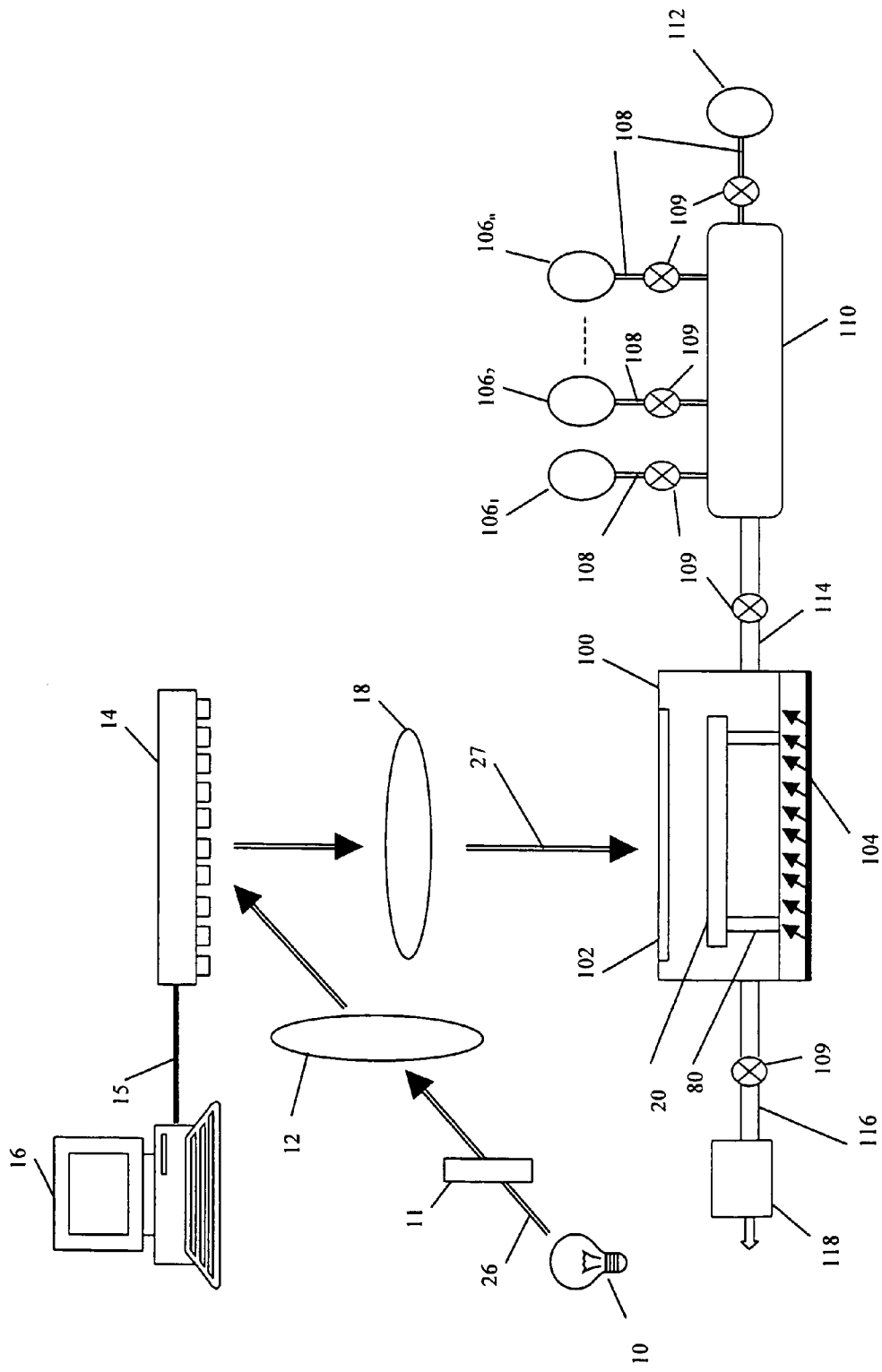
FIG. 5A illustrates a maskless photolithography system for creating patterns on substrates using photochemical vapor deposition.
Figure 5B:
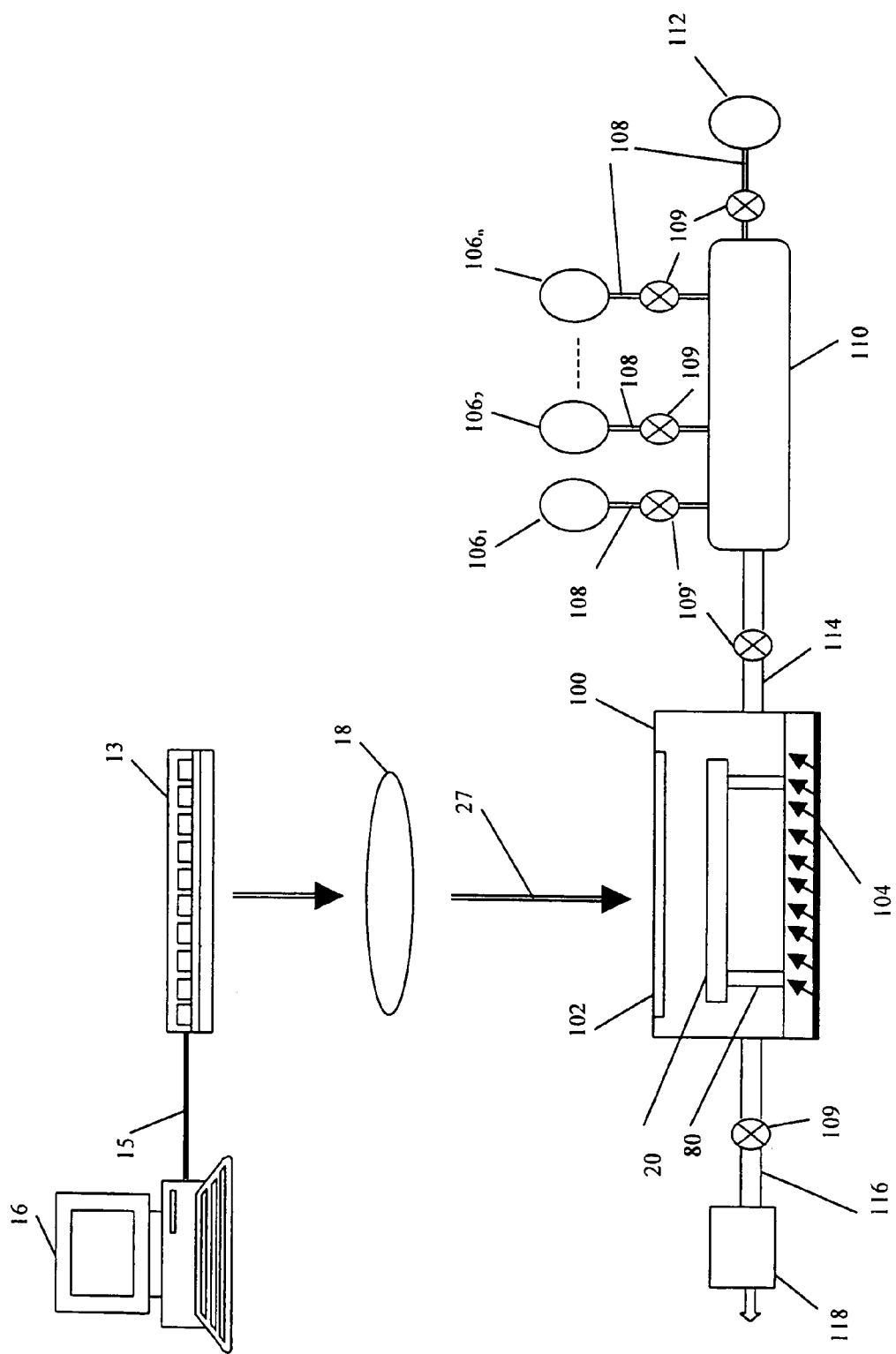
FIG. 5B illustrates a maskless photolithography system comprising a plasma display for creating patterns on substrates using photochemical vapor deposition.

Referring now to FIG. 5A, an embodiment of the current invention for creating thin film devices using chemical vapor deposition (CVD) techniques is depicted. Photochemical vapor deposition (PCVD), as known in the art, uses photochemical reactions to transform gaseous molecules, or precursor gases, into a solid material in the form of a thin film or powder on the surface of a substrate. The use of optical enhancement in the PCVD process advantageously allows the process to be performed at lower temperatures than conventionally required. In the present embodiment, a maskless photolithography system is combined with a PCVD system to enhance and control reactions corresponding to patterned incident light on substrates for fabricating coated objects, such as thin films. The PCVD process involves direct disassociation of molecules by energetic photons and enhances the absorption, surface reactions and desorption steps of a conventional CVD process.

As shown in FIG. 5A, a maskless lithography system for creating thin film devices using PCVD techniques includes a light source 10, a removable filter 11, a first lens system 12, a micromirror array 14, a computer system 16, a second lens system 18, and a substrate 20, affixed to a mount 80, in a deposition chamber 100. The deposition chamber 100 includes a window 102 for allowing patterned light transmission to the mounted substrate 20, Alternatively, a heater 104 is provided to enhance reactions within the deposition chamber 100. In alternative embodiments, a movable alignment fixture 22, upon which the deposition chamber 82 is mounted, and an optical viewer 24 are provided as depicted in FIG. 1A.

To provide precursor gases for deposition, a plurality of precursor gas reservoirs $106_1, 106_2 \ldots 106_n$, are connected to a mixing chamber 110 by gas lines 108 having gas control valves 109 to control the flow of gas into the mixing chamber 110. In addition, a flow gas reservoir 112 is connected to the mixing chamber 110 via a gas line 108, further comprising a control valve 109. The mixing chamber 110 is connected to the deposition chamber 100 through an inlet port 114 having a control valve 109 for introducing gases into the deposition chamber 100. An outlet port 116 having a valve 109 is also connected to the deposition chamber 100 to evacuate gases from the chamber 100. A vacuum system 118 is provided for this purpose.

As shown in FIG. 5A, light source 10 provides a beam of light, or light beam 26, which can be selectively filtered by inserting or removing filter 11 from light beam 26. Light beam 26 is projected upon first lens system 12 and then onto micromirror array 14, wherein each mirror in the micromirror array corresponds to a pixel of the mask pattern. Micromirror array 14 is controlled by computer system 16 over signal line(s) 15 to reflect light according to a desired mask pattern stored in memory. In addition, computer system 16 can shift the desired mask pattern in two dimensions to align the pattern with the substrate 20.

After being reflected in a desired pattern from micromirror array 14, patterned light beam 27 passes through second lens system 18, the window 102 and impinges the substrate 20, thereby creating a light pattern on the substrate 20 mounted in the deposition chamber 100 to cause photoreactive, patterned deposition in the presence of introduced gases.

In an alternate embodiment, a plasma display device 13 can be substituted for the micromirror array 14, light source 10 and associated optics shown in FIG. 4B. Thus, the light source and patterning system can be combined in an integrated plasma display device 13 to directly radiate a patterned light beam 27.

To provide gases for deposition, a desired precursor gas, stored in one of the gas reservoirs 106, is first introduced and mixed with the flow gas, stored in the flow gas reservoir 112, in the mixing chamber 110 by opening the desired valves 109 in the gas lines 108. The mixed gases are then allowed to flow into the deposition chamber 100 and over the substrate 20 for photoreactive deposition on the substrate corresponding to the incident light pattern.

By illuminating the substrate 20, the patterned light beam 27 activates the deposition of the precursor gas introduced in the deposition chamber 100 to build up layers of deposited compounds, resulting in photolithography defined patterns on the substrate 20 corresponding to the incident patterned light beam 27. Layers of different compounds can be successively built up by mixing other precursor gases with a flow gas in the mixing chamber 110 and introducing the mixed gases into the deposition chamber 100 for photoreactive deposition on the substrate 20. To enhance the deposition process, a heater 104 is provided to selectively raise the temperature in the reaction chamber. In an embodiment, the valves 109 are controlled by the computer system 16 for automatically sequencing the steps of releasing precursor and flow gases, mixing the gases, introducing the gases into the deposition chamber, exposing the substrate 20 and evacuating the deposition chamber, thereby providing an automated deposition and exposure system. In addition, the system may be integrated as a batch or semi-continuous operation.

Because the patterned light 27 is computer controlled, the generated mask patterns can be quickly and easily modified to allow rapid sequential thin film deposition. For example the system can be used to produce a variety of films and coatings of metals, semiconductors, and compounds in either crystalline or vitreous forms having high purity and various desirable chemical properties. Alternatively, the present embodiment can be used to produce patterns using photoresist vapor deposition techniques such as evaporation or sputtering or other hybrid vapor deposition processes. The system has the ability to create thin films that have application in a wide variety of fields and applications, including, but not limited to, the applications shown in Table 1 below:

TABLE 1

| Field | Application |
| --- | --- |
| Solid State Electronics | Polysilicon |
| | Dielectric Silicon Oxide ($SiO_2$) |
| | Silicon Nitride (SiN) |
| | Phosphosilicate Glass (PSG) |
| | Borophosphosilicate Glass (BPSG) |
| Metallurgy (including applications as metal conductors) | Aluminum (Al) |
| | Gold (Au) |
| | Chromium (Cr) |
| | Copper (Cu) |
| | Nickel (Ni) |
| | Tantalum (Ta) |
| | Platinum (Pt) |
| | Wolfram (W) |
| Dielectric Films | Silicon Oxide ($SiO_2$) |
| | Silicon Nitride (SiN) |

TABLE 1-continued

| Field | Application |
| --- | --- |
| Optical Interference Filters | Tantalum Pentoxide ($Ta_2O_5$) |
| | Titanium Dioxide ($TiO_2$) |
| Optical Coatings | Anti reflective coatings |
| | Cold light and heat mirrors |
| | Photothermal coatings |
| | Reflectors and Mirrors |

Furthermore, the maskless photolithography vapor deposition system disclosed can be used to advantageously create objects for uses in a variety of applications such as computer disk drives, audio and video tapes, ophthalmic coatings, reflectors in lighting, decorative coatings, mirrors, architectural glass, flat panel displays, automotive microsensors, industrial tool hardening, read-write heads, and food packaging.

Based on the foregoing specification, the computer system of the disclosed invention may be implemented using computer programming or engineering techniques including computer software, firmware, hardware or any combination or subset thereof. Any such resulting program, having computer-readable code means, may be embodied or provided within one or more computer-readable media, thereby making a computer program product, i.e., an article of manufacture, according to the invention. The computer readable media may be, for instance, a fixed (hard) drive, diskette, optical disk, magnetic tape, semiconductor memory such as read-only memory (ROM), etc., or any transmitting/receiving medium such as the Internet or other communication network or link. The article of manufacture containing the computer code may be made and/or used by executing the code directly from one medium, by copying the code from one medium to another medium, or by transmitting the code over a network.

One skilled in the art of computer science will easily be able to combine the software as described with appropriate general purpose or special purpose computer hardware to create a computer system or computer sub-system embodying the method of the invention. An apparatus for making, using or selling the invention may be one or more processing systems including, but not limited to, a central processing unit (CPU), memory, storage devices, communication links and devices, servers, I/O devices, or any sub-components of one or more processing systems, including software, firmware, hardware or any combination or subset thereof, which embody the invention. User input may be received from the keyboard, mouse, pen, voice, touch screen, or any other means by which a human can input data into a computer, including through other programs such as application programs.

It should be understood that the examples and embodiments described herein are for illustrative purposes only and that various modifications or changes in light thereof will be suggested to persons skilled in the art and are to be included within the spirit and purview of the claims.

What is claimed is:

1. A maskless photolithography system for creating molecular imprinted array devices comprising:
   a. a computer system for generating mask patterns and alignment instructions;
   b. a maskless patterned light generator, radiating a patterned light beam corresponding to a molecular probe location, operably connected to and controllable by said computer system;

c. a reaction chamber for mounting a substrate, comprising an inner mount for affixing said substrate within said chamber, so that said substrate is exposed to said patterned light beam;

d. at least one reagent reservoir, fluidically connected to said reaction chamber to selectively provide a photoreactive reagent to the exposed surface of said substrate mounted in said reaction chamber, whereby said patterned light beam impinging on said substrate activates said photoreactive reagent, resulting in creation of patterns on said substrate according to said mask pattern of said patterned light beam; and e. at least one wash reservoir, fluidically connected to said reaction chamber to selectively provide a wash solution to the exposed surface of said substrate mounted in said reaction chamber, wherein said maskless patterned light generator comprises:

a. an array of positionable micromirrors, wherein said micromirrors reflect light according to said mask patterns provided by said computer system;

b. an optical system for generating, collimating, and directing a light beam to said micromirror array; and c. an optical system for further collimating the light beam reflected from said micromirrors and directing said patterned light beam onto said substrate mounted in said reaction chamber and to create patterns on said substrate corresponding to said mask patterns, further comprising a computer controlled pattern modulation system for varying the angular position and duration of exposure of said micromirrors when exposing said substrate, said modulation system altering the positioning of said micromirrors in response to instructions provided by said computer, whereby pixelation and stiction are reduced, the pixelation being reduced by exposing in interpixel areas of substrate not exposed by an axis exposure of micromirrors.

2. The system of claim 1, further comprising a manually controlled alignment fixture for detachably mounting said reaction chamber, wherein said alignment fixture is movable in coplanar first and second dimensions, and in a third dimension direction substantially perpendicular to said first and second coplanar dimensions and substantially parallel to said patterned light beam; said fixture providing three dimensional alignment of said reaction chamber to align said substrate mounted therein with respect to said patterned light beam, wherein said alignment fixture is moved in three dimensions in response to mechanical alignments directly provided by a user.

3. The system of claim 1, further comprising a computer controlled pattern alignment system, for providing electrical alignment of said patterns in coplanar first and second dimensions, wherein said pattern alignment system adjusts the alignment of said mask patterns in coplanar first and second dimensions in response to instructions provided by said computer according to said alignment information, so that said pattern is shifted in at least one coplanar direction.

4. The system of claim 1, further comprising an optical viewer to allow optical monitoring of positioning of said substrate mounted in said reaction chamber by visually verifying that an image projected on said substrate is properly aligned.

5. The system of claim 1, further comprising an optical filter, removably mounted in the light beam to selectively filter light impinging on said substrate to prevent exposure of said substrate during an alignment procedure.

6. The system of claim 1, further comprising control valves to selectively control flow into said reaction chamber from said reagent and said wash reservoirs.

7. The system of claim 6, further comprising computer control of said control valves to operate said valves to automatically control flow into said reaction chamber from said reagent and said wash reservoirs.

8. A method for maskless photolithography for creating molecular imprinted array devices comprising:

a. receiving mask pattern information corresponding to a desired pattern to be created on a substrate;

b. generating mask patterns based on received mask pattern information;

c. providing said mask patterns to a patterned light generator;

d. generating a patterned light beam;

e. providing a reaction chamber for mounting of said substrate within said reaction chamber;

f. providing a photoreactive reagent comprising molecular linkers to said reaction chamber to coat said substrate mounted within said reaction chamber;

g. directing said patterned light beam onto said substrate;

h. exposing said substrate to said patterned light beam; and i. washing said substrate;

whereby said patterned light beam incident on said photoreactive reagent coated substrate creates activated regions of molecular recognition sites on said substrate corresponding to said patterned light beam, wherein generating said patterned light beam further comprises:

a. receiving mask patterns by an array of positionable micromirrors, operably connected to and controllable by a computer system;

b. generating, collimating, and directing a light beam onto said micromirror array;

c. positioning said micromirrors to reflect the light beam from said micromirror array according to said mask patterns provided by said computer system; and d. collimating said patterned light beam reflected from said micromirror array;

whereby the generated light is reflected from said micromirrors in said patterned light beam corresponding to said mask patterns provided by said computer system to expose said substrate and to create patterns on said substrate corresponding to said mask patterns, further comprising varying the angular position and duration of exposure of said micromirrors when exposing said substrate, whereby pixelation and stiction are reduced, the pixelation being reduced by exposing in interpixel areas of substrate not exposed by an axis exposure of micromirrors.

9. The method of claim 8, further comprising:

a. providing selective filtering of the light beam impinging on said substrate to prevent exposure of said substrate during an alignment procedure;

b. allowing manual alignment of said substrate under the light beam by moving said reaction chamber in which said substrate is mounted in three dimensions, wherein said substrate, mounted in said reaction chamber, is moved in coplanar first and second dimensions, and moved in a third dimension direction substantially perpendicular to said first and second coplanar dimensions, and substantially parallel to the light beam reflected from said micromirror array;

c. allowing optical monitoring of positioning of said substrate, mounted in said reaction chamber, under the light beam to visually verify that an image projected on said substrate is properly aligned;
d. receiving alignment information corresponding to alignment of a desired mask pattern projected onto a substrate;
e. generating alignment instructions based on received alignment information;
f. providing alignment instructions, based on said alignment information, to said micromirror array to further align said mask patterns in the coplanar first and second dimensions;
g. adjusting said micromirror array according to said alignment instructions by shifting the mask pattern in at least one of the coplanar first and second dimensions;
h. disabling filtering of the light beam;
i. exposing said substrate; and
j. repeating steps (a-i) to create a desired pattern on said substrate.

10. The system according to claim 1, wherein the photoreactive reagent comprises molecular linkers.

* * * * *

UNITED STATES PATENT AND TRADEMARK OFFICE
CERTIFICATE OF CORRECTION

PATENT NO. : 7,468,238 B2
APPLICATION NO. : 11/297695
DATED : December 23, 2008
INVENTOR(S) : David P. Fries Page 1 of 1

It is certified that error appears in the above-identified patent and that said Letters Patent is hereby corrected as shown below:

Column 1,
Line 27, "ctching a dcsircd pattcrn on thc substratc corrcsponding to thc" should read --etching a desired pattern on the substrate corresponding to the--.

Column 5,
Line 19, "scvcral million clcmcnts to modulatc light" should read --several million elements to modulate light--.

Column 10,
Line 19, "gucst molcculc introduccd by anothcr fluid linc 83 on thc" should read --guest molecule introduced by another fluid line 83 on the--.

Column 13,
Lines 56-57, "3-aminopropyltriethooxysiline" should read --3-aminopropyltriethoxysiline--.

Signed and Sealed this

Twenty-third Day of June, 2009

JOHN DOLL
*Acting Director of the United States Patent and Trademark Office*